(12) United States Patent
Fukutomi et al.

(10) Patent No.: US 9,174,235 B2
(45) Date of Patent: Nov. 3, 2015

(54) SUBSTRATE TREATING APPARATUS USING HORIZONTAL TREATMENT CELL ARRANGEMENTS WITH PARALLEL TREATMENT LINES

(75) Inventors: Yoshiteru Fukutomi, Kyoto (JP);
Tsuyoshi Mitsuhashi, Kyoto (JP);
Hiroyuki Ogura, Shimogyo-ku (JP);
Kenya Morinishi, Kyoto (JP); Yasuo Kawamatsu, Kyoto (JP); Hiromichi Nagashima, Kyoto (JP)

(73) Assignee: Screen Semiconductor Solutions Co., Ltd., Kyoto (JP)

( * ) Notice: Subject to any disclaimer, the term of this patent is extended or adjusted under 35 U.S.C. 154(b) by 0 days.

(21) Appl. No.: 13/401,625

(22) Filed: Feb. 21, 2012

(65) Prior Publication Data

US 2012/0145073 A1     Jun. 14, 2012

Related U.S. Application Data

(63) Continuation of application No. 12/163,951, filed on Jun. 27, 2008, now Pat. No. 8,851,008.

(30) Foreign Application Priority Data

Jun. 29, 2007   (JP) ................................ 2007-172496

(51) Int. Cl.
*B05C 13/00* (2006.01)
*H01L 21/67* (2006.01)
*B05D 3/04* (2006.01)
*B05B 15/12* (2006.01)

(52) U.S. Cl.
CPC ............ *B05C 13/00* (2013.01); *H01L 21/6715* (2013.01); *H01L 21/67017* (2013.01); *H01L 21/67173* (2013.01); *H01L 21/67178* (2013.01); *H01L 21/67184* (2013.01); *B05B 15/1248* (2013.01); *B05D 3/0486* (2013.01); *Y10S 414/135* (2013.01)

(58) Field of Classification Search
CPC ............... H01L 21/67173; H01L 21/67184; H01L 21/67178; H01L 21/67161; H01L 21/6715; H01L 21/67098; G03F 7/16; G05B 2219/45031; G05B 19/4189; Y10S 414/135; B05C 13/00; B05C 13/02; B05C 15/00; B05D 3/0486; B05D 3/209; B05D 7/24
USPC .......... 118/58, 63, 600, 620, 633; 355/27, 30; 396/611, 624, 627; 414/935, 152, 414/416.03; 134/1, 157, 34, 56 R, 6, 61, 62, 134/345, 31, 345.33; 348/E7.085, 87; 427/248.1, 314; 430/325; 700/247, 700/258; 706/912; 901/10, 16, 7
See application file for complete search history.

(56) References Cited

U.S. PATENT DOCUMENTS

| | | | |
|---|---|---|---|
| 5,028,195 A * | 7/1991 | Ishii et al. ...................... 414/783 |
| 5,100,516 A | 3/1992 | Nishimura et al. | |
| 5,102,283 A * | 4/1992 | Balzola Elorza ............. 414/404 |
| 5,177,514 A * | 1/1993 | Ushijima et al. .............. 396/624 |
| 5,202,716 A | 4/1993 | Tateyama et al. | |
| 5,275,709 A | 1/1994 | Anderle et al. | |
| 5,297,910 A | 3/1994 | Yoshioka et al. | |
| 5,430,271 A | 7/1995 | Orgami et al. | |
| 5,518,542 A * | 5/1996 | Matsukawa et al. ............ 118/52 |
| 5,565,034 A | 10/1996 | Nanbu et al. | |
| 5,571,325 A | 11/1996 | Ueyama et al. | |
| 5,664,254 A | 9/1997 | Ohkura et al. | |
| 5,668,056 A | 9/1997 | Wu et al. | |
| 5,668,733 A | 9/1997 | Morimoto et al. | |
| 5,672,205 A | 9/1997 | Fujimoto et al. | |
| 5,677,758 A | 10/1997 | McEachern et al. | |
| 5,725,664 A | 3/1998 | Nanbu et al. | |
| 5,788,868 A | 8/1998 | Itaba et al. | |
| 5,803,932 A | 9/1998 | Akimoto et al. | |
| 5,820,679 A | 10/1998 | Yokoyama et al. | |
| 5,826,129 A | 10/1998 | Hasebe et al. | |
| 5,844,662 A | 12/1998 | Akimoto et al. | |
| 5,858,863 A | 1/1999 | Yokoyama et al. | |
| 5,876,280 A | 3/1999 | Kitano et al. | |
| 5,928,390 A | 7/1999 | Yaeggashi et al. | |
| 5,937,223 A | 8/1999 | Akimoto et al. | |
| 5,963,753 A | 10/1999 | Ohtani et al. | |
| 5,972,110 A | 10/1999 | Akimoto | |

| | | | |
|---|---|---|---|
| 5,976,199 A | 11/1999 | Wu et al. | |
| 6,027,262 A * | 2/2000 | Akimoto | 396/611 |
| 6,062,798 A | 5/2000 | Muka | |
| 6,063,439 A | 5/2000 | Semba et al. | |
| 6,099,598 A | 8/2000 | Yokoyama et al. | |
| 6,099,643 A * | 8/2000 | Ohtani et al. | 118/52 |
| 6,116,841 A * | 9/2000 | Iwasaki | 414/416.01 |
| 6,146,083 A * | 11/2000 | Iwasaki | 414/744.3 |
| 6,151,981 A * | 11/2000 | Costa | 74/490.03 |
| 6,161,969 A | 12/2000 | Kimura et al. | |
| 6,176,667 B1 | 1/2001 | Fairbairn et al. | |
| 6,227,786 B1 * | 5/2001 | Tateyama | 118/724 |
| 6,264,748 B1 * | 7/2001 | Kuriki et al. | 118/719 |
| 6,266,125 B1 | 7/2001 | Fukuda et al. | |
| 6,270,306 B1 | 8/2001 | Otwell et al. | |
| 6,287,023 B1 | 9/2001 | Yaegashi et al. | |
| 6,287,025 B1 * | 9/2001 | Matsuyama | 396/611 |
| 6,333,003 B1 | 12/2001 | Katano et al. | |
| 6,338,582 B1 | 1/2002 | Ueda | |
| 6,377,329 B1 | 4/2002 | Takekuma | |
| 6,382,895 B1 | 5/2002 | Konishi et al. | |
| 6,402,401 B1 | 6/2002 | Ueda et al. | |
| 6,426,303 B1 | 7/2002 | Ueda | |
| 6,444,029 B1 * | 9/2002 | Kimura et al. | 118/52 |
| 6,454,472 B1 * | 9/2002 | Kim et al. | 414/940 |
| 6,464,789 B1 | 10/2002 | Akimoto | |
| 6,466,300 B1 | 10/2002 | Deguchi | |
| 6,485,203 B2 | 11/2002 | Katano et al. | |
| 6,491,451 B1 | 12/2002 | Stanley et al. | |
| 6,537,835 B2 | 3/2003 | Adachi et al. | |
| 6,558,053 B2 | 5/2003 | Shigemori et al. | |
| 6,590,634 B1 | 7/2003 | Nishi et al. | |
| 6,680,775 B1 | 1/2004 | Hirakawa | |
| 6,698,944 B2 | 3/2004 | Fujita | |
| 6,750,155 B2 | 6/2004 | Halsey et al. | |
| 6,752,543 B2 * | 6/2004 | Fukutomi et al. | 396/571 |
| 6,752,872 B2 | 6/2004 | Inada et al. | |
| 6,758,647 B2 | 7/2004 | Kaji et al. | |
| 6,832,863 B2 * | 12/2004 | Sugimoto et al. | 414/269 |
| 6,879,866 B2 | 4/2005 | Tel et al. | |
| 6,889,014 B2 | 5/2005 | Takano | |
| 6,893,171 B2 | 5/2005 | Fukutomi et al. | |
| 6,937,917 B2 | 8/2005 | Akiyama et al. | |
| 6,955,595 B2 | 10/2005 | Kim | |
| 6,982,102 B2 | 1/2006 | Inada et al. | |
| 7,001,674 B2 | 2/2006 | Irie | |
| 7,008,124 B2 | 3/2006 | Miyata | |
| 7,017,658 B2 | 3/2006 | Hisai et al. | |
| 7,053,990 B2 | 5/2006 | Galburt et al. | |
| 7,069,099 B2 | 6/2006 | Hashinoki et al. | |
| 7,241,061 B2 | 7/2007 | Akimoto et al. | |
| 7,245,348 B2 | 7/2007 | Akimoto et al. | |
| 7,262,829 B2 | 8/2007 | Hayashida et al. | |
| 7,279,067 B2 | 10/2007 | Yoshida et al. | |
| 7,281,869 B2 | 10/2007 | Akimoto et al. | |
| 7,317,961 B2 | 1/2008 | Hashinoki et al. | |
| 7,322,756 B2 | 1/2008 | Akimoto et al. | |
| 7,323,060 B2 | 1/2008 | Yamada et al. | |
| 7,335,090 B2 * | 2/2008 | Takahashi | 451/41 |
| 7,497,633 B2 | 3/2009 | Kaneyama et al. | |
| 7,522,823 B2 | 4/2009 | Fukimoto et al. | |
| 7,525,650 B2 | 4/2009 | Shiga et al. | |
| 7,537,401 B2 * | 5/2009 | Kim et al. | 396/611 |
| 7,549,811 B2 | 6/2009 | Yamada et al. | |
| 7,604,424 B2 | 10/2009 | Shigemori et al. | |
| 7,641,405 B2 | 1/2010 | Fukutomi | |
| 7,645,081 B2 | 1/2010 | Hara et al. | |
| 7,651,306 B2 | 1/2010 | Rice et al. | |
| 7,652,276 B2 | 1/2010 | Hayakawa et al. | |
| 7,675,048 B2 * | 3/2010 | Binns et al. | 250/492.21 |
| 7,686,559 B2 | 3/2010 | Tsujimoto et al. | |
| 7,692,764 B2 | 4/2010 | Shirata | |
| 7,729,798 B2 | 6/2010 | Hayashida et al. | |
| 7,758,341 B2 * | 7/2010 | Dong-Hun | 432/247 |
| 7,801,633 B2 | 9/2010 | Yamamoto et al. | |
| 7,809,460 B2 | 10/2010 | Ishida et al. | |
| 7,819,079 B2 | 10/2010 | Englhardt et al. | |
| 7,836,845 B2 * | 11/2010 | Tanoue et al. | 118/500 |
| 7,841,072 B2 | 11/2010 | Matsuoka et al. | |
| 7,871,211 B2 | 1/2011 | Matsuoka et al. | |
| 7,925,377 B2 | 4/2011 | Ishikawa et al. | |
| 7,934,880 B2 | 5/2011 | Hara et al. | |
| 8,034,190 B2 | 10/2011 | Yasuda et al. | |
| 8,113,141 B2 * | 2/2012 | Oh | 118/320 |
| 8,113,142 B2 * | 2/2012 | Oh | 118/320 |
| 8,154,106 B2 | 4/2012 | Ishida et al. | |
| 8,220,354 B2 * | 7/2012 | Todorov | 74/490.05 |
| 8,268,384 B2 | 9/2012 | Matshuoka et al. | |
| 8,289,496 B2 * | 10/2012 | Kim et al. | 355/27 |
| 8,342,761 B2 * | 1/2013 | Matsuoka | 396/611 |
| 8,353,986 B2 | 1/2013 | Sasaski et al. | |
| 8,419,341 B2 | 4/2013 | Hoey et al. | |
| 8,443,513 B2 * | 5/2013 | Ishida et al. | 29/771 |
| 8,545,118 B2 | 10/2013 | Ogura et al. | |
| 8,560,108 B2 | 10/2013 | Matsuyama et al. | 700/112 |
| 8,612,807 B2 * | 12/2013 | Collins, Jr. | 714/57 |
| 8,631,809 B2 * | 1/2014 | Hamada et al. | 134/133 |
| 8,708,587 B2 | 4/2014 | Ogura et al. | |
| 8,731,701 B2 | 5/2014 | Tsukinoki et al. | |
| 8,851,008 B2 | 10/2014 | Fukutomi et al. | |
| 2001/0013161 A1 | 8/2001 | Kitano et al. | |
| 2001/0013515 A1 * | 8/2001 | Harada et al. | 219/390 |
| 2001/0031147 A1 | 10/2001 | Takamori et al. | |
| 2002/0011207 A1 | 1/2002 | Uzawa et al. | |
| 2002/0048509 A1 * | 4/2002 | Sakata et al. | 414/800 |
| 2002/0053319 A1 | 5/2002 | Nagamine | |
| 2003/0079957 A1 * | 5/2003 | Otaguro et al. | 198/346.1 |
| 2003/0098966 A1 | 5/2003 | Korenaga et al. | |
| 2003/0147643 A1 | 8/2003 | Miyata et al. | |
| 2003/0213431 A1 * | 11/2003 | Fukutomi et al. | 118/696 |
| 2003/0216053 A1 | 11/2003 | Miyata | |
| 2004/0005149 A1 | 1/2004 | Sugimoto et al. | |
| 2004/0007176 A1 | 1/2004 | Janakiraman et al. | |
| 2004/0050321 A1 * | 3/2004 | Kitano et al. | 118/300 |
| 2004/0061065 A1 | 4/2004 | Hashimoto et al. | |
| 2004/0122545 A1 | 6/2004 | Akiyama et al. | |
| 2004/0182318 A1 | 9/2004 | Hashinoki et al. | |
| 2004/0229441 A1 | 11/2004 | Sugimoto et al. | |
| 2005/0030511 A1 | 2/2005 | Auer-Jongepier et al. | |
| 2005/0042555 A1 | 2/2005 | Matsushita et al. | |
| 2005/0061441 A1 | 3/2005 | Hashinoki et al. | |
| 2005/0069400 A1 * | 3/2005 | Dickey et al. | 414/277 |
| 2005/0135905 A1 | 6/2005 | Moriya et al. | |
| 2005/0266323 A1 | 12/2005 | Raulea | |
| 2006/0011296 A1 | 1/2006 | Higashi et al. | |
| 2006/0024446 A1 | 2/2006 | Sugimoto et al. | |
| 2006/0028630 A1 | 2/2006 | Akimoto | |
| 2006/0062282 A1 | 3/2006 | Wright | |
| 2006/0098978 A1 | 5/2006 | Yasuda et al. | |
| 2006/0104635 A1 | 5/2006 | Kaneyama et al. | |
| 2006/0137726 A1 | 6/2006 | Sano et al. | |
| 2006/0147202 A1 | 7/2006 | Yasuda et al. | |
| 2006/0162858 A1 | 7/2006 | Akimoto et al. | |
| 2006/0194445 A1 | 8/2006 | Hayashi et al. | |
| 2006/0201423 A1 | 9/2006 | Akimoto et al. | |
| 2006/0201615 A1 | 9/2006 | Matsuoka et al. | |
| 2006/0219171 A1 | 10/2006 | Sasaki et al. | |
| 2006/0286300 A1 | 12/2006 | Ishikawa et al. | |
| 2007/0048979 A1 | 3/2007 | Fukuoka et al. | |
| 2007/0056514 A1 | 3/2007 | Akimoto et al. | |
| 2007/0058147 A1 | 3/2007 | Hamada | |
| 2007/0128529 A1 | 6/2007 | Kazaana | |
| 2007/0172234 A1 | 7/2007 | Shigemori et al. | |
| 2007/0179658 A1 | 8/2007 | Hamada | |
| 2007/0190437 A1 | 8/2007 | Kaneyama et al. | |
| 2007/0219660 A1 | 9/2007 | Kaneko et al. | |
| 2007/0274711 A1 * | 11/2007 | Kaneyama et al. | 396/611 |
| 2007/0280680 A1 * | 12/2007 | Kim et al. | 396/564 |
| 2007/0297794 A1 | 12/2007 | Park et al. | |
| 2008/0014333 A1 * | 1/2008 | Matsuoka et al. | 427/8 |
| 2008/0026153 A1 | 1/2008 | Hayashida et al. | |
| 2008/0070164 A1 | 3/2008 | Hayashida et al. | |
| 2008/0129968 A1 | 6/2008 | Hayashida et al. | |
| 2008/0158531 A1 | 7/2008 | Kiuchi | |
| 2008/0212049 A1 | 9/2008 | Fukutomi et al. | |
| 2008/0224817 A1 | 9/2008 | Vellore et al. | |
| 2008/0269937 A1 * | 10/2008 | Yamamoto | 700/112 |
| 2008/0304940 A1 * | 12/2008 | Auer-Jongepier et al. | 414/152 |

| | | | | | | |
|---|---|---|---|---|---|---|
| 2009/0000543 A1 | 1/2009 | Fukutomi et al. | | JP | 2001-093827 A1 | 6/2001 |
| 2009/0001071 A1 | 1/2009 | Kulkarni | | JP | 2001-176792 A1 | 6/2001 |
| 2009/0014126 A1 | 1/2009 | Ohtani et al. | | JP | 03-211749 A | 9/2001 |
| 2009/0018686 A1 | 1/2009 | Yamamoto et al. | | JP | 2002-510141 A1 | 2/2002 |
| 2009/0044747 A1 | 2/2009 | Nishimura | | JP | 2003-059810 A1 | 2/2003 |
| 2009/0060480 A1 | 3/2009 | Herchen | | JP | 2003-224175 A1 | 8/2003 |
| 2009/0070946 A1* | 3/2009 | Tamada et al. ............ 15/21.1 | | JP | 2003-309160 A1 | 10/2003 |
| 2009/0098298 A1* | 4/2009 | Miyata et al. ............ 427/372.2 | | JP | 2003-324059 A1 | 11/2003 |
| 2009/0139450 A1 | 6/2009 | Ogura et al. | | JP | 2003-324139 | 11/2003 |
| 2009/0139833 A1 | 6/2009 | Ogura | | JP | 2003-338496 A1 | 11/2003 |
| 2009/0142162 A1 | 6/2009 | Ogura et al. | | JP | 2004-15021 A1 | 1/2004 |
| 2009/0142713 A1* | 6/2009 | Yamamoto ............ 430/325 | | JP | 2004-015023 A1 | 1/2004 |
| 2009/0143903 A1* | 6/2009 | Blust et al. ............ 700/231 | | JP | 2004-31921 A1 | 1/2004 |
| 2009/0149982 A1 | 6/2009 | Higashi et al. | | JP | 2004-087675 | 3/2004 |
| 2009/0165711 A1 | 7/2009 | Ogura et al. | | JP | 2004-046450 | 5/2004 |
| 2009/0165712 A1 | 7/2009 | Ogura et al. | | JP | 2004-152801 A1 | 5/2004 |
| 2009/0165950 A1* | 7/2009 | Kim et al. ............ 156/345.1 | | JP | 2004-193597 A | 7/2004 |
| 2009/0247053 A1* | 10/2009 | Lee ............ 451/11 | | JP | 2004-200485 A1 | 7/2004 |
| 2009/0291558 A1* | 11/2009 | Kim et al. ............ 438/689 | | JP | 2004-207279 A1 | 7/2004 |
| 2010/0050940 A1 | 3/2010 | Sahoda et al. | | JP | 2004-241319 A1 | 8/2004 |
| 2010/0061718 A1 | 3/2010 | Hara et al. | | JP | 2004-260129 | 9/2004 |
| 2010/0126527 A1 | 5/2010 | Hamada | | JP | 3600711 | 9/2004 |
| 2010/0136257 A1 | 6/2010 | Yasuda et al. | | JP | 2004-304003 A1 | 10/2004 |
| 2010/0183807 A1* | 7/2010 | Kim ............ 427/248.1 | | JP | 2004-311714 A1 | 11/2004 |
| 2010/0191362 A1 | 7/2010 | Tsukinoki | | JP | 2004-319767 A1 | 11/2004 |
| 2010/0192844 A1 | 8/2010 | Kim et al. | | JP | 2005-57294 | 3/2005 |
| 2010/0195066 A1* | 8/2010 | Kim et al. ............ 355/27 | | JP | 2005-093920 A1 | 4/2005 |
| 2011/0043773 A1* | 2/2011 | Matsuoka ............ 355/27 | | JP | 2005-101078 A1 | 4/2005 |
| 2011/0063588 A1 | 3/2011 | Kashiyama et al. | | JP | 2005-123249 A1 | 5/2005 |
| 2011/0078898 A1* | 4/2011 | Ishida et al. ............ 29/771 | | JP | 2005-167083 A1 | 6/2005 |
| 2011/0242508 A1 | 10/2011 | Kobayashi | | JP | 2005-243690 A1 | 9/2005 |
| 2012/0013730 A1 | 1/2012 | Koga | | JP | 2006-203075 | 8/2006 |
| 2012/0029687 A1* | 2/2012 | Hagen et al. ............ 700/218 | | JP | 2006-216614 A1 | 8/2006 |
| 2012/0073461 A1 | 3/2012 | Terada et al. | | JP | 2006-228974 A1 | 8/2006 |
| 2012/0086142 A1 | 4/2012 | Terada et al. | | JP | 2006-229183 A1 | 8/2006 |
| 2012/0097336 A1 | 4/2012 | Terada et al. | | JP | 2006-253501 A1 | 9/2006 |
| 2012/0145074 A1 | 6/2012 | Fukutomi et al. | | JP | 2006-269672 A1 | 10/2006 |
| 2012/0156380 A1 | 6/2012 | Fukutomi et al. | | JP | 2006-287178 A1 | 10/2006 |
| 2012/0307217 A1* | 12/2012 | Kim et al. ............ 355/30 | | JP | 2006-335484 A1 | 12/2006 |
| 2014/0000514 A1 | 1/2014 | Ogura et al. | | JP | 2007-005659 A1 | 1/2007 |
| 2014/0003891 A1* | 1/2014 | Kobayashi ............ 414/217 | | JP | 2007-288029 A1 | 1/2007 |
| 2014/0342558 A1 | 11/2014 | Ogura et al. | | JP | 2007-067178 A1 | 3/2007 |
| | | | | JP | 2007-150071 A1 | 6/2007 |
| | | | | JP | 2007-158260 A1 | 6/2007 |
| | | | | JP | 2007-208064 A1 | 8/2007 |

FOREIGN PATENT DOCUMENTS

| | | |
|---|---|---|
| CN | 1773672 | 5/2006 |
| JP | H01-241840 A1 | 9/1989 |
| JP | H04-085812 A1 | 3/1992 |
| JP | H-085812 A1 | 3/1992 |
| JP | H06-5689 A1 | 1/1994 |
| JP | H06-89934 A1 | 3/1994 |
| JP | H07-283094 A1 | 10/1995 |
| JP | H08-162514 A1 | 6/1996 |
| JP | H09-045613 A1 | 2/1997 |
| JP | H9-148240 A1 | 6/1997 |
| JP | 09-199568 | 7/1997 |
| JP | H09-251953 A1 | 9/1997 |
| JP | 09-312323 A1 | 12/1997 |
| JP | H10-50794 A1 | 2/1998 |
| JP | H10-74822 | 3/1998 |
| JP | H10-144673 A1 | 5/1998 |
| JP | 10-146744 A1 | 6/1998 |
| JP | 10-209241 | 7/1998 |
| JP | H10-189420 A1 | 7/1998 |
| JP | H10-261689 A1 | 9/1998 |
| JP | H10-294351 A1 | 11/1998 |
| JP | H10-335415 A1 | 12/1998 |
| JP | H11-16978 A1 | 1/1999 |
| JP | H11-3851 A | 6/1999 |
| JP | H11-251405 A1 | 9/1999 |
| JP | 11-340301 A | 12/1999 |
| JP | 2000-012443 A1 | 1/2000 |
| JP | 2000-049089 A1 | 2/2000 |
| JP | 2000-100886 A1 | 4/2000 |
| JP | 2000-124124 A1 | 4/2000 |
| JP | 2000-124129 A1 | 4/2000 |
| JP | 2000-200822 A1 | 7/2000 |
| JP | 2000-269297 A1 | 9/2000 |
| JP | 2000-331922 | 11/2000 |
| JP | 2007-227984 | 9/2007 |
| JP | 2007-287887 A1 | 11/2007 |
| JP | 2009-99577 A1 | 5/2009 |
| JP | 2009-164256 A1 | 7/2009 |
| JP | 2009-076893 A1 | 9/2009 |
| KR | 1997-0011065 A1 | 3/1997 |
| KR | 1999-0023624 A | 3/1999 |
| KR | 2001-0029862 A | 4/2001 |
| KR | 2002-0035758 A1 | 5/2002 |
| KR | 10-0387418 B1 | 6/2003 |
| KR | 10-2003-0087418 A | 11/2003 |
| KR | 2003-086900 A | 11/2003 |
| KR | 10-2004-0054517 A | 6/2004 |
| KR | 1020050049935 A1 | 5/2005 |
| KR | 10-2005-0051280 A | 6/2005 |
| KR | 10-2006-0033423 A | 4/2006 |
| KR | 10-2006-0088495 A | 4/2006 |
| KR | 2006-0050112 A | 5/2006 |
| KR | 10-2006-0085188 A | 7/2006 |
| KR | 10-2006-0088495 A | 8/2006 |
| KR | 10-2006-0092061 A | 8/2006 |
| KR | 10-2006-0097613 A | 9/2006 |
| KR | 10-0634122 B1 | 10/2006 |
| KR | 10-2007-0007262 A | 1/2007 |
| KR | 2007-0003328 A | 1/2007 |
| KR | 10-0698352 A | 3/2007 |
| KR | 10-2007-0062522 A | 6/2007 |
| TW | 200631680 | 9/2006 |

OTHER PUBLICATIONS

Office Action for corresponding Taiwanese Application No. 097150912 dated Jun. 1, 2012, 6 pages.

Notice of Allowance for corresponding Korean Patent Application No. 10-2008-0132009 dated Jun. 22, 2012, 3 pages.
Office Action for corresponding Japanese Application No. 2007-310675 dated Jul. 31, 2012, 3 pages.
Office Action for corresponding Korean Patent Application No. 10-2012-0005204 dated Nov. 1, 2012, 6 pages.
Office Action for corresponding Chinese Application No. 20081010225036.7 dated Sep. 18, 2009, 4 pages.
Office Action for corresponding Korean Application No. 10-2008-0060084 dated Mar. 9, 2010, 5 pages.
Notice of Allowance of Korean Application No. 10-2008-0118967 dated Oct. 21, 2010, 2 pages total.
Office Action for corresponding Korean Application No. 10-2008-0132304 mailed Oct. 25, 2010, 4 pages.
Office Action for corresponding Korean Application No. 10-2008-0132009 dated Jan. 18, 2011, 5 pages.
Invalidation Trial for corresponding Korean Patent No. 10-1001511 received on Apr. 13, 2011, 53 pages.
Notice of Allowance for corresponding Korean application No. 10-2010-0105888 dated Apr. 22, 2011, 3 pages.
Invalidation Trial for corresponding Korean Application No. 10-1010086 dated Apr. 25, 2011, 68 pages.
Office Action for corresponding Korean Application No. 10-2008-0132009 dated Jul. 21, 2011, 5 pages.
Office Action for corresponding Japanese Application No. 2007-172496 dated Sep. 27, 2011, 4 pages.
Invalidation Trial for corresponding Korean Patent No. 10-1036420 received on Sep. 27, 2011, 36 pages.
Office Action for corresponding Japanese Application No. 2007-340427 dated Oct. 4, 2011, 2 pages.
Office Action for corresponding Japanese Application No. 2007-340428 dated Oct. 4, 2011, 2 pages.
Invalidation Trial for corresponding Korean Patent No. 10-1047799 (Korean Patent application No. 10-2008-132304) received on Nov. 16, 2011, 69 pages.
Office Action for corresponding Japanese Application No. 2008-076610 dated Jan. 10, 2012, 2 pages.
Office Action for corresponding Japanese Application No. 2008-076611 dated Jan. 10, 2012.
Office Action for corresponding Japanese Application No. 2008-076608 dated Jan. 17, 2012, 4 pages.
Office Action for corresponding Taiwanese Application No. 097150911 dated Apr. 10, 2012, 6 pages.
Office Action for corresponding Japanese Application No. 2007-340428 dated Apr. 24, 2012, 3 pages.
Office Action for corresponding Japanese Application No. 2007-310676 dated May 8, 2012, 3 pages.
Office Action for corresponding Japanese Application No. 2007-310677 dated May 8, 2012, 4 pages.
Non-Final Office Action for U.S. Appl. No. 12/324,788 mailed May 27, 2011, 41 pages.
Non-Final Office Action for U.S. Appl. No. 12/163,951 mailed Jul. 11, 2011, 18 pages.
Non-Final Office Action for U.S. Appl. No. 12/343,302 mailed Aug. 19, 2011, 26 pages.
Non-Final Office Action for U.S. Appl. No. 12/324,802 mailed Sep. 14, 2011, 13 pages.
Non-Final Office Action for U.S. Appl. No. 12/343,292 mailed Oct. 28, 2011, 12 pages.
Final Office Action for U.S. Appl. No. 12/324,788 mailed Dec. 7, 2011, 26 pages.
Final Office Action for U.S. Appl. No. 12/163,951 mailed Jan. 19, 2012, 22 pages.
Non-Final Office Action for U.S. Appl. No. 12/324,794 mailed Feb. 3, 2012, 8 pages.
Final Office Action for U.S. Appl. No. 12/343,302 mailed Apr. 12, 2012, 33 pages.
Final Office Action for U.S. Appl. No. 12/324,802 mailed Apr. 20, 2012, 14 pages.
Final Office Action for U.S. Appl. No. 12/343,292 mailed Jun. 1, 2012, 15 pages.
Decision of Patent for corresponding Japanese Application No. 2007-310677 dated Oct. 16, 2012, 3 pages.
Advisory Action for U.S. Appl. No. 12/343,292 mailed Oct. 12, 2012, 3 pages.
Argument in the Trial for Patent Invalidation for corresponding Korean Patent No. 10-1213284, dated Dec. 20, 2013, 19 pages.
Notice of Allowance for corresponding Korean Patent Application No. 10-2012-0005204 dated Jan. 22, 2014, 3 pages.
Final Office Action for U.S. Appl. No. 13/401,644 mailed Nov. 22, 2013, 20 pages.
Restriction Requirement for U.S. Appl. No. 12/163,951 mailed Feb. 3, 2014, 7 pages.
Supplemental Notice of Allowance for U.S. Appl. No. 14/011,993 mailed on Apr. 1, 2014, 2 pages.
Non-Final Office Action for U.S. Appl. No. 13/401,644 mailed on Apr. 4, 2014, 10 pages.
Non-Final Office Action for U.S. Appl. No. 12/324,788 mailed on Apr. 4, 2014, 30 pages.
Non-Final Office Action for U.S. Appl. No. 12/324,802 mailed on Apr. 7, 2014, 17 pages.
Non-Final Office Action for U.S. Appl. No. 12/343,302 mailed on Apr. 10, 2014, 22 pages.
Restriction Requirement for U.S. Appl. No. 12/343,292 mailed on Apr. 10, 2014, 6 pages.
Argument in the Trial for Patent Invalidation for corresponding Korean Patent No. 10-1170211 dated Feb. 27, 2014, 21 pages. (English translation is not available).
Information Statement for corresponding Japanese Patent Application No. 2012-118583 dated May 16, 2014, 22 pages. (translation is not available).
Machine Translation of KR 10-2006-0033423 A published Apr. 19, 2006, 14 pages.
Office Action for corresponding Japanese Patent Application No. 2012-118583 dated Jun. 24, 2014, 2 pages. (translation is not available).
Notice of Allowance for U.S. Appl. No. 12/163,951 mailed on Jul. 10, 2014, 9 pages.
Final Office Action for U.S. Appl. No. 13/401,617 mailed on Jun. 2, 2014, 10 pages.
Argument in the Trial for Patent Invalidation for corresponding Korean Patent No. 10-1276946 dated May 28, 2014, 45 pages. (English translation is no available).
Trial for Patent Invalidation for corresponding Korean Patent Application No. 10-1432358 dated Nov. 18, 2014, 54 pages. (English translation is not available).
Non-Final Office Action for U.S. Appl. No. 13/401,617 mailed on Feb. 2, 2015, 11 pages.
Office Action for corresponding Taiwanese Patent Application No. 101118484 dated Feb. 26, 2015, 15 pages. (English translation is not available).
U.S. Appl. No. 14/447,409, filed Jul. 30, 2014 by Ogura et al.
Final Office Action for U.S. Appl. No. 12/324,802 mailed on Oct. 22, 2014, 24 pages.
Final Office Action for U.S. Appl. No. 12/343,292 mailed on Nov. 5, 2014, 20 pages.
Final Office Action for U.S. Appl. No. 12/324,788 mailed on Nov. 6, 2014, 44 pages.
Advisory Action for U.S. Appl. No. 13/401,617 mailed on Nov. 7, 2014, 4 pages.
Final Office Action for U.S. Appl. No. 13/401,644 mailed on Dec. 1, 2014, 20 pages.
Invalidation Trial for corresponding Korean Patent No. 10-1170211 dated Aug. 7, 2013, 26 pages.
U.S. Appl. No. 14/011,993, filed Aug. 28, 2013 by Ogura et al.
Non-Final Office Action for U.S. Appl. No. 13/401,617 mailed Sep. 17, 2013, 8 pages.
Office Action for corresponding Japanese Patent Application No. 2012-118584 dated Oct. 22, 2013, 2 pages.
Notice of Allowance for U.S. Appl. No. 14/011,993 mailed Oct. 7, 2013, 11 pages.
Notice of Allowance for U.S. Appl. No. 12/324,794 mailed May 29, 2013, 7 pages.
Non-Final Office Action for U.S. Appl. No. 13/401,644 mailed Jun. 21, 2013, 16 pages.

Office Action for corresponding Japanese Patent Application No. 2008-327897 dated Nov. 6, 2012, 4 pages.
Office Action for corresponding Japanese Patent Application No. 2007-340430 dated Dec. 18, 2012, 3 pages.
Information Statement for corresponding Japanese Patent Application No. 2007-310676 dated Jan. 15, 2013, 4 pages.
Office Action for corresponding Japanese Patent Application 2011-265835 dated Apr. 23, 2013, 3 pages.
Invalidation Trial for corresponding Korean Patent No. 10-1213284 dated Jul. 3, 2013, 31 pages.
Invalidation trial for corresponding Taiwanese Patent No. 97124376 dated Jul. 30, 2013, 43 pages.
Trial Decision for corresponding Korean Patent No. 10-1047799 dated Jun. 25, 2013, 125 pages.
Office Action for corresponding Japanese Patent Application No. 2012-118585 dated Jun. 25, 2013, 3 pages.
Office Action for corresponding Japanese Patent Application No. 2011-257538 dated Jul. 2, 2013, 3 pages.
Office Action for corresponding Japanese Patent Application No. 2011-257538, dated Dec. 3, 2013, 3 pages.
Invalidation Trial for corresponding Korean Patent No. 10-1276946, dated Nov. 12, 2013, 52 pages.

* cited by examiner

*Primary Examiner* — Dah-Wei D. Yuan
*Assistant Examiner* — Karl Kurple

(74) *Attorney, Agent, or Firm* — Kilpatrick Townsend & Stockton LLP

(57) ABSTRACT

A substrate treating apparatus includes a treating block including a plurality of cells arranged one over another. Each cell has treating units for treating substrates and a single main transport mechanism disposed in a transporting space for transporting the substrates to the treating units. The treating units include solution treating units and heat-treating units. The solution treating units are arranged at one side of the transporting space, the heat-treating units are arranged at the other side of the transporting space, and the main transport mechanism and the treating units are in substantially the same layout in plan view for the respective cells. The solution treating units are in substantially the same layout in side view for the respective cells, the heat-treating units are in substantially the same layout in side view for the respective cells, and treatments of the substrates carried out in the respective cells are the same.

10 Claims, 12 Drawing Sheets

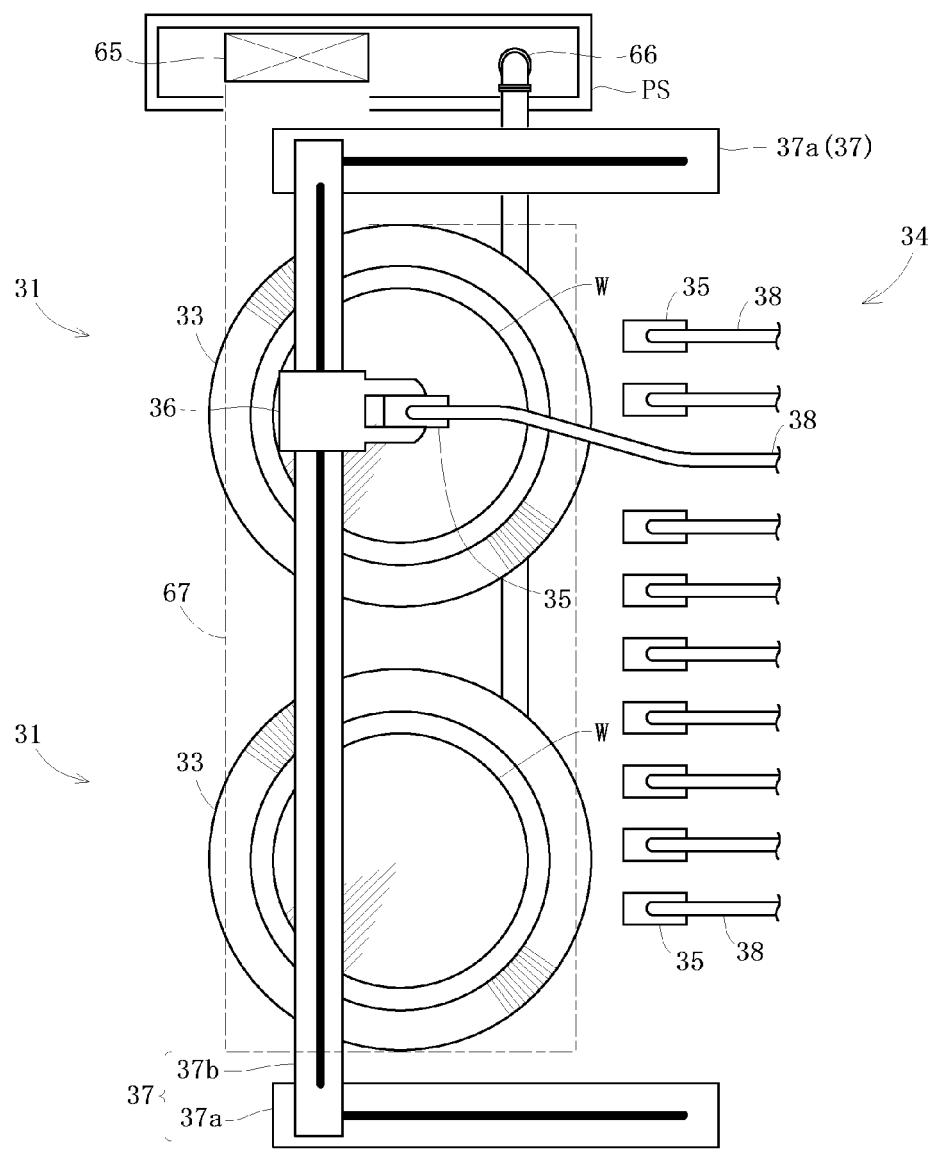
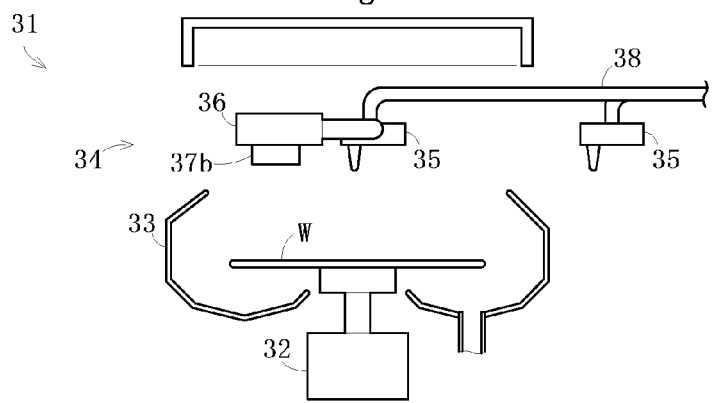

SUBSTRATE TREATING APPARATUS USING HORIZONTAL TREATMENT CELL ARRANGEMENTS WITH PARALLEL TREATMENT LINES

CROSS-REFERENCES TO RELATED APPLICATIONS

This application is a continuation of U.S. patent application Ser. No. 12/163,951, which claims priority to Japanese Patent Application No. 2007-172496, filed Jun. 29, 2007. The disclosures of both of these applications are hereby incorporated by reference in their entirety for all purposes.

BACKGROUND OF THE INVENTION (1) Field of the Invention

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

(2) Description of the Related Art

Conventionally, a substrate treating apparatus is used to form a resist film on substrates, allows the substrates having the resist film formed thereon to be exposed in a separate exposing machine, and develops the exposed substrates. Specifically, the substrate treating apparatus includes a plurality of blocks each having various chemical treating units such as coating units for forming resist film and heat-treating units arranged with a single main transport mechanism. This apparatus transports substrates to each block to be treated therein (as disclosed in Japanese Unexamined Patent Publication No. 2003-324139, for example).

The conventional apparatus with such a construction has the following drawback.

In the conventional apparatus, the main transport mechanism goes through five to 10 transporting steps for treating each substrate in its block, and each transporting step takes several seconds. Supposing that the number of transporting steps is six and each step takes five seconds, the throughput in the block can be raised up to 30 seconds per substrate (or 120 substrates per hour). However, there is not much room for reducing the number of transporting steps for the single main transport mechanism or shortening the time for each transporting step. Hence, it is difficult to achieve a further improvement in throughput of each block. It is therefore difficult to improve the throughput of the entire apparatus. One possible solution is to employ multiple main transport mechanisms. However, an increase in the number of main transport mechanisms in each block entails the inconvenience of increasing the chemical treating units and heating units, thereby enlarging the footprint.

SUMMARY OF THE INVENTION

One of the objectives of this invention is to provide a substrate treating apparatus that can improve throughput without enlarging the footprint of the substrate treating apparatus.

In one embodiment, a substrate treating apparatus comprising a plurality of substrate treatment lines each including a plurality of main transport mechanisms arranged horizontally, and a plurality of treating units provided for each of the main transport mechanisms for treating substrates; each of the substrate treatment lines carrying out a series of treatments of the substrates, with each of the main transport mechanisms transporting the substrates to the treating units associated therewith, and transferring the substrates to the other main transport mechanism horizontally adjacent thereto; wherein the substrate treatment lines are arranged vertically.

According to this embodiment, the plurality of substrate treatment lines are arranged vertically, so that the substrates are treated in parallel through the respective substrate treatment lines. This realizes an increased throughput of the substrate treating apparatus. Since the substrate treatment lines are arranged vertically, an increase in the installation area of the substrate treating apparatus can be avoided.

The horizontal arrangement of the main transport mechanisms is arbitrary. For example, the main transport mechanisms may be arranged in one row or a plurality of rows extending in one direction. The main transport mechanisms may be arranged at different points on an imaginary curve, or may be arranged in a zigzag pattern. The arrangement of the treating units associated with each main transport mechanism is also arbitrary. The treating units may be arranged horizontally, stacked vertically, or arranged crisscross in a matrix form.

In an alternate embodiment, the main transport mechanisms and the treating units in the respective substrate treatment lines may be in substantially the same arrangement in plan view. One of the benefits realized by this arrangement is that the apparatus construction can be simplified.

The substrate treating apparatus may further comprise gas supply openings for supplying a gas into transporting spaces where the main transport mechanisms are installed, and gas exhaust openings for exhausting the gas from the transporting spaces. This provides the benefit of maintaining the transportation areas substantially free from particulate matter.

In addition, the area of the transporting spaces for each substrate treatment line may be blocked off and separate gas supply openings and gas exhaust openings can be provided for each substrate treatment line. This will result in even cleaner transporting spaces.

The gas supply openings may be formed in a blowout unit and the gas exhaust openings formed in an exhaust unit with at least one of the gas blowout unit and the gas exhaust unit blocking off atmosphere for each of the substrate treatment lines. This realizes a simplified apparatus construction.

The gas supply openings may be arranged in a position higher than the gas exhaust openings further reducing possibility of particulate contamination.

The gas supply openings may be arranged over the transporting spaces, and the gas exhaust openings under the transporting spaces. This arrangement results in downward gas currents and helps to keep the transporting spaces cleaner.

In still another embodiment, the apparatus may further comprise an indexer's transport mechanism for transporting the substrates to and from a cassette for storing a plurality of substrates, wherein the indexer's transport mechanism transfers the substrates to and from an end transport mechanism which is one of the main transport mechanisms located in one end region of each of the substrate treatment lines, the indexer's transport mechanism transferring the substrates to and from an upper one of the end transport mechanisms at a height adjacent to a lower portion of the upper one of the end transport mechanisms, and transferring the substrates to and from a lower one of the end transport mechanisms at a height adjacent to an upper portion of the lower one of the end transport mechanisms. Since the upper and lower substrate transfer positions are close to each other, the indexer's transport mechanism moves a reduced amount vertically. This improves the operating efficiency of the indexer's transport mechanism.

The apparatus may further comprise a receiver provided between the indexer's transport mechanism and each end transport mechanism for receiving the substrates, the indexer's transport mechanism transferring the substrates through the receiver. The transfer of substrates through the receiver can improve the transporting efficiency over the case of transferring the substrates directly between the transport mechanisms.

In yet another embodiment, a substrate treating apparatus comprises a plurality of treating blocks arranged horizontally, each including treating units arranged on each of upper and lower stories, and a main transport mechanism provided for each of the stories for transporting substrates to the treating units on each of the stories; wherein a series of treatments is performed for the substrates by transferring the substrates between the main transport mechanisms of the treating blocks adjacent each other on the same story.

According to this embodiment, substrates are transported to and from the plurality of treating blocks arranged horizontally, and in parallel through the different stories. A series of treatments are performed on the substrates in parallel on the respective stories, each having the plurality of treating blocks. This realizes an increased throughput of the substrate treating apparatus. Since the treating blocks have a layered structure with a plurality of stories arranged vertically, an increase in the installation area of the substrate treating apparatus can be avoided.

In the embodiment noted above, each of the treating blocks may have a housing for collectively accommodating the treating units and the main transport mechanisms included in each of the treating blocks. Then, each treating block can be handled as a unit, thereby simplifying the manufacture and repair of the substrate treating apparatus.

Each of the treating blocks may further include a shielding plate disposed between the respective stories, gas supply openings for supplying a clean gas into a transporting space of the main transport mechanism on each story, and gas exhaust openings for exhausting the gas from the transporting space of the main transport mechanism on each story. This construction can prevent any particles generated by each main transport mechanism from reaching the other story. The transporting space on each story can also be kept clean.

In the above construction, the gas supply openings may be formed in a blowout unit, and the gas exhaust openings in an exhaust unit, at least one of the gas blowout unit and the gas exhaust unit acting as the shielding plate. This simplifies the apparatus construction.

The gas supply openings of each transporting space may be arranged in a position higher than the gas exhaust openings of the transporting space. Then, the air currents in each transporting space form a down-flow, which can keep the transporting space even cleaner.

The apparatus may further comprise an indexer's transport mechanism for transporting the substrates to and from a cassette for storing a plurality of substrates, and for transporting the substrates to the main transport mechanisms on the respective stories of an end one of the treating blocks, wherein the indexer's transport mechanism transfers the substrates, in positions adjacent each other, to and from the main transport mechanisms on the respective stories of the end one of the treating blocks. This enables the indexer's transport mechanism to perform reduced amount of vertical movement, thereby improving the operating efficiency of the indexer's transport mechanism.

The above construction may further comprise substrate receivers provided between the main transport mechanisms on the respective stories of the end one of the treating blocks and the indexer's transport mechanism, the indexer's transport mechanism transferring the substrates through each of the receivers. This construction realizes an improved transporting efficiency compared to transferring the substrates directly between the transport mechanisms.

In a still another embodiment, a substrate treating apparatus comprises an indexer section including an indexer's transport mechanism for transporting substrates to and from a cassette for storing a plurality of substrates; a coating block disposed adjacent the indexer section, and including coating units and heat-treating units arranged on each of upper and lower stories for forming resist film on the substrates, and a main transport mechanism disposed on each story for transporting the substrates to and from the coating units and the heat-treating units on the each story; a developing block disposed adjacent the coating block, and including developing units and heat-treating units arranged on each of upper and lower stories for developing the substrates, and a main transport mechanism disposed on each story for transporting the substrates to and from the developing units and the heat-treating units on the each story; and an interface section disposed adjacent the developing block, and including an interface's transport mechanism for transporting the substrates to and from an exposing machine provided separately from the apparatus; wherein the indexer's transport mechanism transfers the substrates to and from the main transport mechanism on each story of the coating block; the main transport mechanism on each story of the coating block transfers the substrates to and from the main transport mechanism on the same story of the developing block; and the interface's transport mechanism transfers the substrates to and from the main transport mechanism on each story of the developing block.

According to this embodiment, the indexer's transport mechanism takes the substrates out of the cassette in order, and transfers these substrates to the main transport mechanisms on the respective stories of the coating block. Each main transport mechanism of the coating block transports the substrates to the associated coating units and heat-treating units. Each treatment unit carries out a predetermined treatment of the substrates. The main transport mechanism on each story of the coating block transfers the substrates having resist film formed thereon to the main transport mechanism on the same story of the adjoining developing block. Each main transport mechanism of the developing block transfers the substrates to the interface's transport mechanism of the adjoining interface section. The interface's transport mechanism transfers the received substrates to the exposing machine, which is an external apparatus. The exposed substrates are returned to the interface section again. The interface section's transport mechanism transfers the substrates to the main transport mechanism on each story of the developing block. Each main transport mechanism of the developing block transports the substrates to the associated developing units and heat-treating units. Each treating unit carries out a predetermined treatment of the substrates. The main transport mechanism on each story of the developing block transfers the developed substrates the main transport mechanism on the same story of the adjoining coating block. The main transport mechanism on each story of the coating block transfers the substrates to the indexer's transport mechanism of the indexer section. The indexer's transport mechanism stores the substrates in a predetermined cassette. According to this construction, as described above, the coating block and developing block carry out the resist film forming treatment and developing treatment in parallel on each story. This construction, therefore, increases the treating efficiency of the substrate treating apparatus. Since the coating block and developing block have a layered structure with a plurality of stories arranged vertically, an increase in the footprint can be avoided.

The apparatus may further comprise a controller for controlling the interface's transport mechanism to transport the substrates to the exposing machine in an order in which the indexer's transport mechanism has taken the substrates out of the cassette. This helps with tracking multiple substrates within the apparatus.

The interface section may further include a plurality of buffers to temporarily store the substrates. The controller being arranged to control the interface's transport mechanism, when the substrates are delivered from the developing block in an order different from the order in which the indexer's transport mechanism has taken the substrates out of the cassette, to receive the substrates and transport the substrates to the buffers. The substrates are transferred to the buffers in the event that the substrates are delivered from the developing block in an order different from the order in which the indexer's transport mechanism initially took the substrates out of the cassette. This allows the developing block to deliver succeeding substrates. Further, the order of transporting the substrates from the interface section to the exposing machine may be adjusted to the order in which the indexer's transport mechanism has taken the substrates out of the cassette. Thus, the substrates can be treated conveniently in a predetermined order.

The coating units for forming resist film on the substrates may include a resist film coating unit for applying a resist film material to the substrates, and an anti-reflection film coating unit for applying an anti-reflection film forming solution to the substrates.

This specification discloses several embodiments directed to the following substrate treating apparatus:

(1) A substrate treating apparatus is provided wherein the series of treatments carried out in each of the substrate treatment lines is the same.

According to the embodiment defined in (1) above, the apparatus construction can be simplified.

(2) A substrate treating apparatus is provided wherein said treating units include solution treating units for treating the substrates with a solution, and heat-treating units for heat-treating the substrates.

(3) A substrate treating apparatus is provided in another embodiment wherein said treating units include solution treating units for treating the substrates with a solution, and heat-treating units for heat-treating the substrates.

According to the embodiment defined in (2) and (3) above, various treatments can be carried out for the substrates.

(4) A substrate treating apparatus is provided further comprising a single, second gas supply pipe for supplying a clean gas to each of the treating units associated with the respective main transport mechanisms arranged vertically.

According to the embodiment defined in (4) above, the installation area can be reduced.

(5) A substrate treating apparatus is provided in which the main transport mechanisms on the respective stories of each treating block are arranged in the same position in plan view.

According to the embodiment defined in (5) above, the apparatus construction can be simplified.

(6) A substrate treating apparatus is provided in which the treating units arranged vertically of each treating block perform the same treatment.

According to the embodiment defined in (6) above, the apparatus construction can be simplified.

(7) A substrate treating apparatus is provided further comprising a single, second gas supply pipe for supplying a clean gas to the treating units arranged vertically.

According to the embodiment defined in (7) above, the installation area can be reduced.

(8) A substrate treating apparatus is provided wherein the treating units on each story are stacked.

According to the embodiment defined in (8) above, the apparatus construction can be simplified.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 8A is a plan view of coating units;

FIG. 8B is a sectional view of a coating unit,

DETAILED DESCRIPTION OF SPECIFIC EMBODIMENTS

Embodiments of this invention will be described in detail hereinafter with reference to the drawings.

Figure 1:
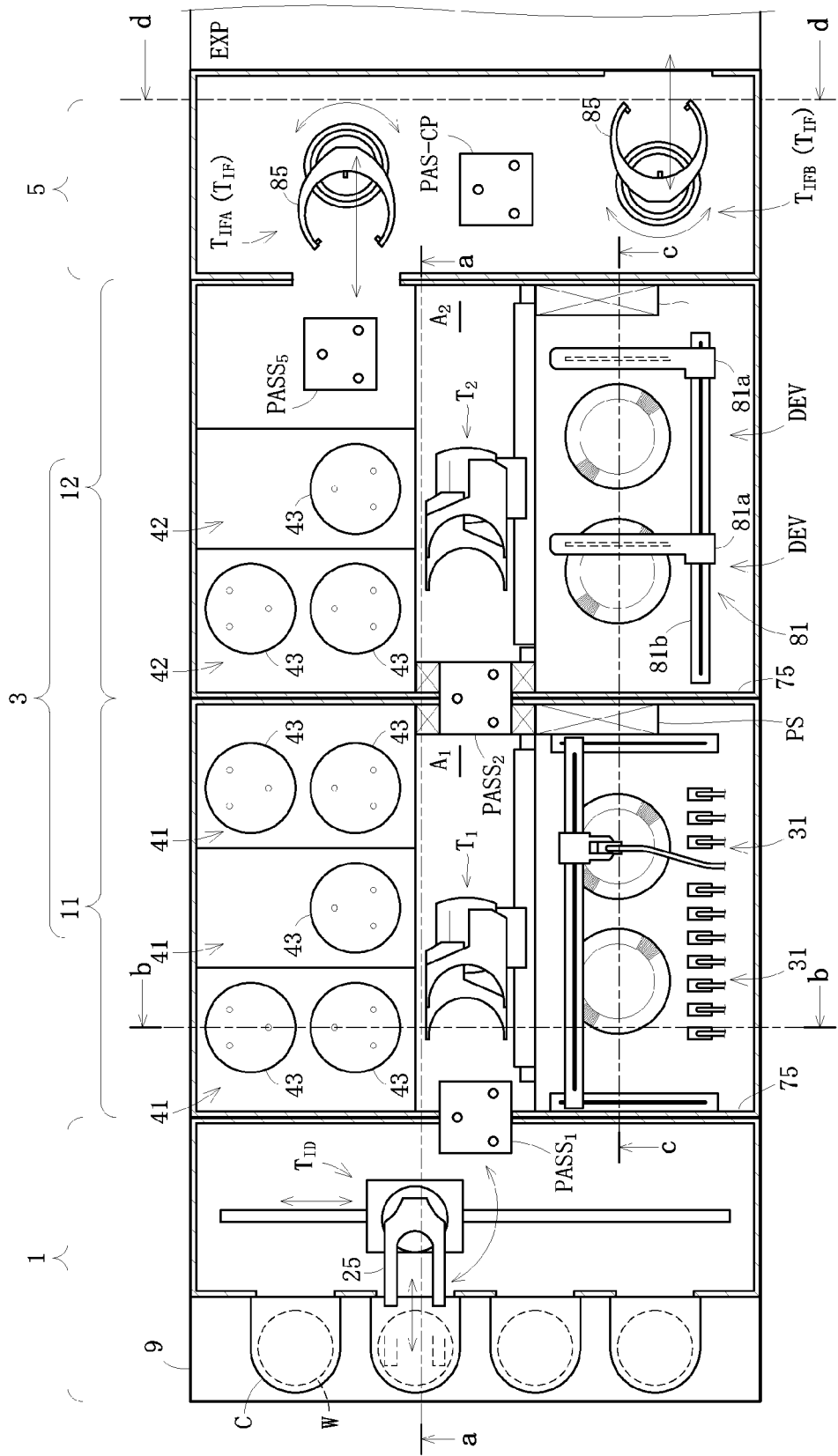
FIG. 1 is a plan view showing an outline of a substrate treating apparatus according to an embodiment of the present invention.
Figure 2:
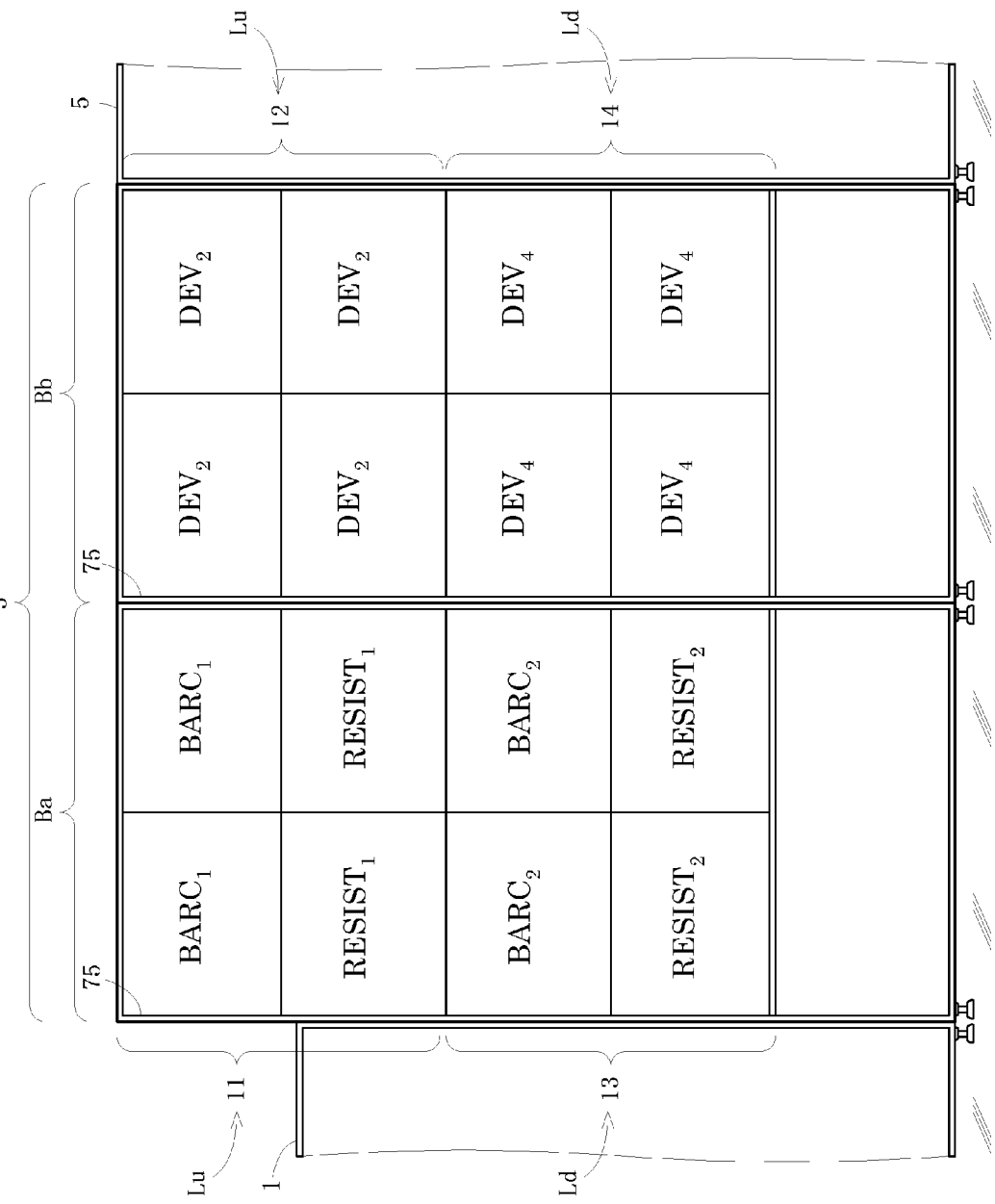
FIG. 2 is a schematic side view showing an arrangement of treating units included in the substrate treating apparatus.
Figure 3:
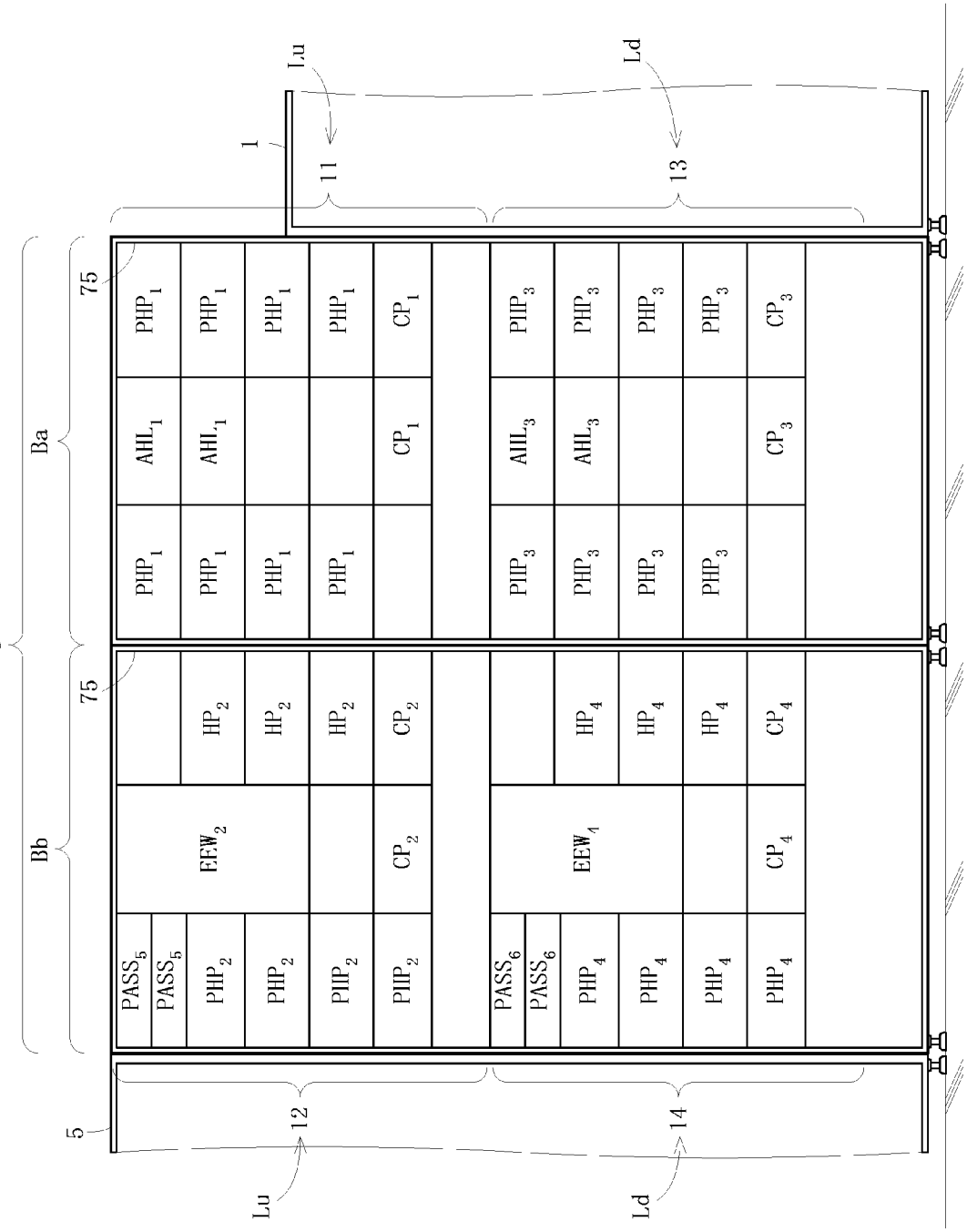
FIG. 3 is a schematic side view showing an arrangement of treating units included in the substrate treating apparatus.

FIG. 1 is a plan view showing an outline of a substrate treating apparatus according to an embodiment of the present invention. FIGS. 2 and 3 are schematic side views showing an arrangement of treating units included in the substrate treating apparatus. FIGS. 4 through 7 are views in vertical section taken on lines a-a, b-b, c-c and d-d of FIG. 1, respectively.

This embodiment provides a substrate treating apparatus for forming resist film on substrates (e.g. semiconductor wafers) W, and developing exposed wafers or substrates W. This apparatus is divided into an indexer section (hereinafter called "ID section") 1, a treating section 3, and an interface section (hereinafter called "IF section") 5. The ID section 1 and IF section 5 are arranged adjacent to and on the opposite sides of the treating section 3. An exposing machine EXP which is an external apparatus separate from this apparatus is disposed adjacent to the IF section 5.

The ID section 1 takes wafers W out of each cassette C, which stores a plurality of wafers W, and deposits wafers W in the cassette C. The ID section 1 has a cassette table 9 for receiving cassettes C and an ID's transport mechanism $T_{ID}$ for transporting wafers W to and from each cassette C. The ID's transport mechanism $T_{ID}$ corresponds to the indexer's transport mechanism in this embodiment.

The treating section 3 includes four main transport mechanisms $T_1$, $T_2$, $T_3$ and $T_4$. The treating section 3 is divided into a first to a fourth cells 11, 12, 13 and 14 associated with the respective main transport mechanisms $T_1$, $T_2$, $T_3$ and $T_4$. The first and third cells 11 and 13 are used for forming resist film on the wafers W. The second and fourth cells 12 and 14 are used for developing the wafers W. Each of the cells 11-14 has a plurality of treating units (to be described hereinafter). The main transport mechanisms $T_1$, $T_2$, $T_3$ and $T_4$ transport the wafers W to and from the treating units of the respective cells 11-14.

The first and second cells 11 and 12 juxtaposed horizontally are connected to each other to form a substrate treatment line Lu extending between the ID section 1 and IF section 5. The third and fourth cells 13 and 14 juxtaposed horizontally are also connected to each other to form a substrate treatment line Ld extending between the ID section 1 and IF section 5. These two substrate treatment lines Lu and Ld are arranged one over the other. In other words, the treating section 3 has a layered structure with the plurality of substrate treatment lines Lu and Ld arranged vertically.

The substrate treatment lines Lu and Ld are arranged one over the other to adjoin each other. That is, the first cell 11 is located over the third cell 13, and the second cell 12 over the fourth cell 14. Therefore, the treating section 3 may be constructed easily by horizontally arranging a treating block Ba having the first and third cells 11 and 13 formed integrally, and a treating block Bb having the second and fourth cells 12 and 14 formed integrally.

The IF section 5 transfers wafers W to and from the exposing machine EXP. The IF section 5 has IF's transport mechanisms $T_{IF}$ for transporting wafers W. The IF's transport mechanisms $T_{IF}$ include a first transport mechanism $T_{IFA}$ and a second transport mechanism $T_{IFB}$. The first transport mechanism $T_{IFA}$ and second transport mechanism $T_{IFB}$ correspond to the interface's transport mechanisms in this embodiment.

The ID's transport mechanism $T_{ID}$ transfers wafers W to and from the main transport mechanisms $T_1$ and $T_3$ of the first and third cells 11 and 13 located adjacent the ID section 1. The main transport mechanisms $T_1$-$T_4$ of the cells 11-14 transfer wafers W to and from the other cells connected thereto on the same stories. The IF's transport mechanisms $T_{IF}$ transfer wafers W to and from the main transport mechanisms $T_2$ and $T_4$ of the second and fourth cells 12 and 14 located adjacent the IF section 5. As a result, wafers W are transported between the ID section 1 and IF section 5 in parallel through the two substrate treatment lines Lu and Ld, to undergo a series of treatments in each of the substrate treatment lines Lu and Ld. The main transport mechanisms $T_1$ and $T_3$ correspond to the end transport mechanisms in this embodiment.

This apparatus includes receivers $PASS_1$ and $PASS_3$ for transferring wafers W between the ID's transport mechanism $T_{ID}$ and main transport mechanisms $T_1$ and $T_3$. Similarly, a receiver $PASS_2$ is provided for transferring wafers W between the main transport mechanisms $T_1$ and $T_2$, and a receiver $PASS_4$ for transferring wafers W between the main transport mechanisms $T_3$ and $T_4$. Further, receivers $PASS_5$ and $PASS_6$ are provided for transferring wafers W between the main transport mechanisms $T_2$ and $T_4$ and IF's transport mechanisms $T_{IF}$. Each of the receivers $PASS_1$-$PASS_E$ has a plurality of support pins projecting therefrom, for receiving a wafer W in a substantially horizontal position on these support pins.

[ID Section 1]

The ID section 1 will be described next. The cassette table 9 can receive four cassettes C arranged in a row. The ID's transport mechanism $T_{ID}$ has a movable base 21 for moving horizontally alongside the cassette table 9 in the direction of arrangement of the cassettes C, a lift shaft 23 vertically extendible and contractible relative to the movable base 21, and a holding arm 25 swivelable on the lift shaft 23, and extendible and retractable radially of the swivel motion, for holding a wafer W. The ID's transport mechanism TID can transport wafers W between each cassette C and the receivers $PASS_1$ and $PASS_3$.

[First Cell 11]

A belt-like transporting space A1 for transporting wafers W extends through the center of the first cell 11 and parallel to the direction of arrangement of the first and second cells 11 and 12. The treating units of the first cell 11 are coating units 31 for applying a treating solution to the wafers W, and heat-treating units 41 for heat-treating the wafers W. The coating units 31 are arranged on one side of the transporting space $A_1$, while the heat-treating units 41 are arranged on the other side thereof.

The coating units 31 are arranged vertically and horizontally, each facing the transporting space A1. In this embodiment, four coating units 31 in total are arranged in two columns and two rows. The coating units 31 include anti-reflection film coating units BARC for forming anti-reflection film on the wafers W, and resist film coating units RESIST for forming resist film on the wafers W. The coating units 31 correspond to the solution treating units in this embodiment.

Reference is made to FIGS. 8A and 8B. FIG. 8A is a plan view of the coating units 31. FIG. 8B is a sectional view of a coating unit 31. Each coating unit 31 includes a spin holder 32 for holding and spinning a wafer W, a cup 33 surrounding the wafer W, and a supply device 34 for supplying a treating solution to the wafer W. The two sets of spin holders 32 and cups 33 at each level are juxtaposed with no partition wall or the like in between. The supply device 34 includes a plurality of nozzles 35, a gripper 36 for gripping one of the nozzles 35, and a nozzle moving mechanism 37 for moving the gripper 36 to move one of the nozzles 35 between a treating position above the wafer W and a standby position away from above the wafer W. Each nozzle 35 has one end of a treating solution pipe 38 connected thereto. The treating solution pipe 38 is arranged movable to permit movement of the nozzle 35 between the standby position and treating position. The other end of each treating solution pipe 38 is connected to a treating solution source (not shown). Specifically, in the case of anti-reflection film coating units BARC, the treating solution sources supply different types of treating solution for antireflection film to the respective nozzles 35. In the case of resist film coating units RESIST, the treating solution sources supply different types of resist film material to the respective nozzles 35.

The nozzle moving mechanism 37 has first guide rails 37*a* and a second guide rail 37*b*. The first guide rails 37*a* are arranged parallel to each other and outwardly of the two cups 33 arranged sideways. The second guide rail 37*b* is slidably supported by the two first guide rails 37*a* and disposed above the two cups 33. The gripper 36 is slidably supported by the second guide rail 37*b*. The first guide rails 37*a* and second guide rail 37*b* take guiding action substantially horizontally and in directions substantially perpendicular to each other. The nozzle moving mechanism 37 further includes drive members (not shown) for sliding the second guide rail 37b, and sliding the gripper 36. The drive members are operable to move the nozzle 35 gripped by the gripper 36 to the treating positions above the two spin holders 32.

Figure 5:
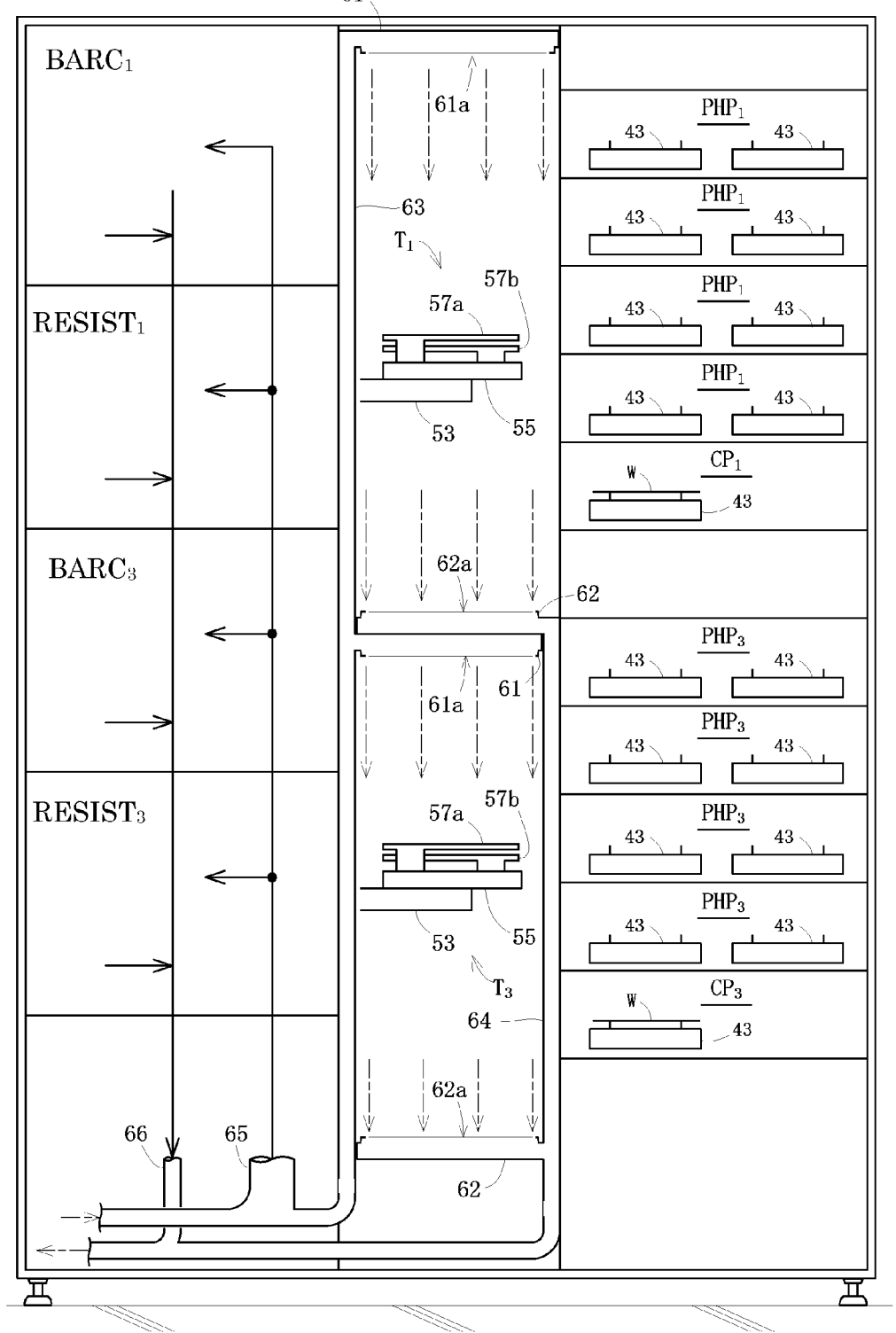
FIG. 5 is a view in vertical section taken on line b-b of FIG. 1.
Figure 6:
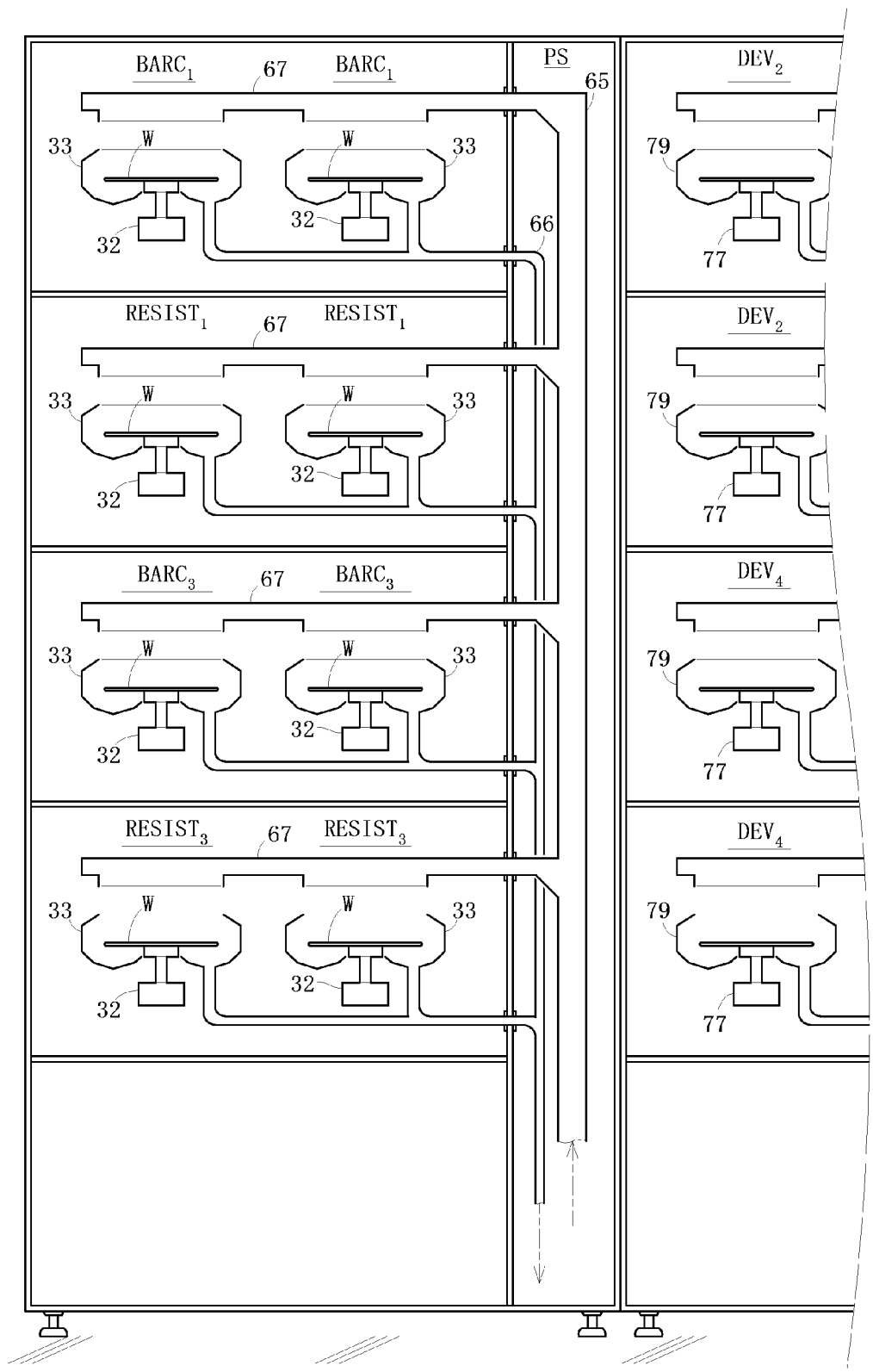
FIG. 6 is a view in vertical section taken on line c-c of FIG. 1.

Referring back to FIG. 1 and FIG. 3, the plurality of heat-treating units 41 are arranged vertically and horizontally, each facing the transporting space A1. In this embodiment, three heat-treating units 41 can be arranged horizontally, and five heat-treating units 41 can be stacked vertically. Each heat-treating unit 41 has a plate 43 for receiving a wafer W. The heat-treating units 41 include cooling units CP for cooling wafers W, heating and cooling units PHP for carrying out heating and cooling treatments continually, and adhesion units AHL for heat-treating wafers W in an atmosphere of hexamethyl silazane (HMDS) vapor in order to promote adhesion of coating film to the wafers W. As shown in FIG. 5, each heating and cooling unit PHP has two plates 43, and a local transport mechanism (not shown) for moving a wafer W between the two plates 43. The various types of heat-treating units CP, PHP and AHL are arranged in appropriate positions.

Figure 9:
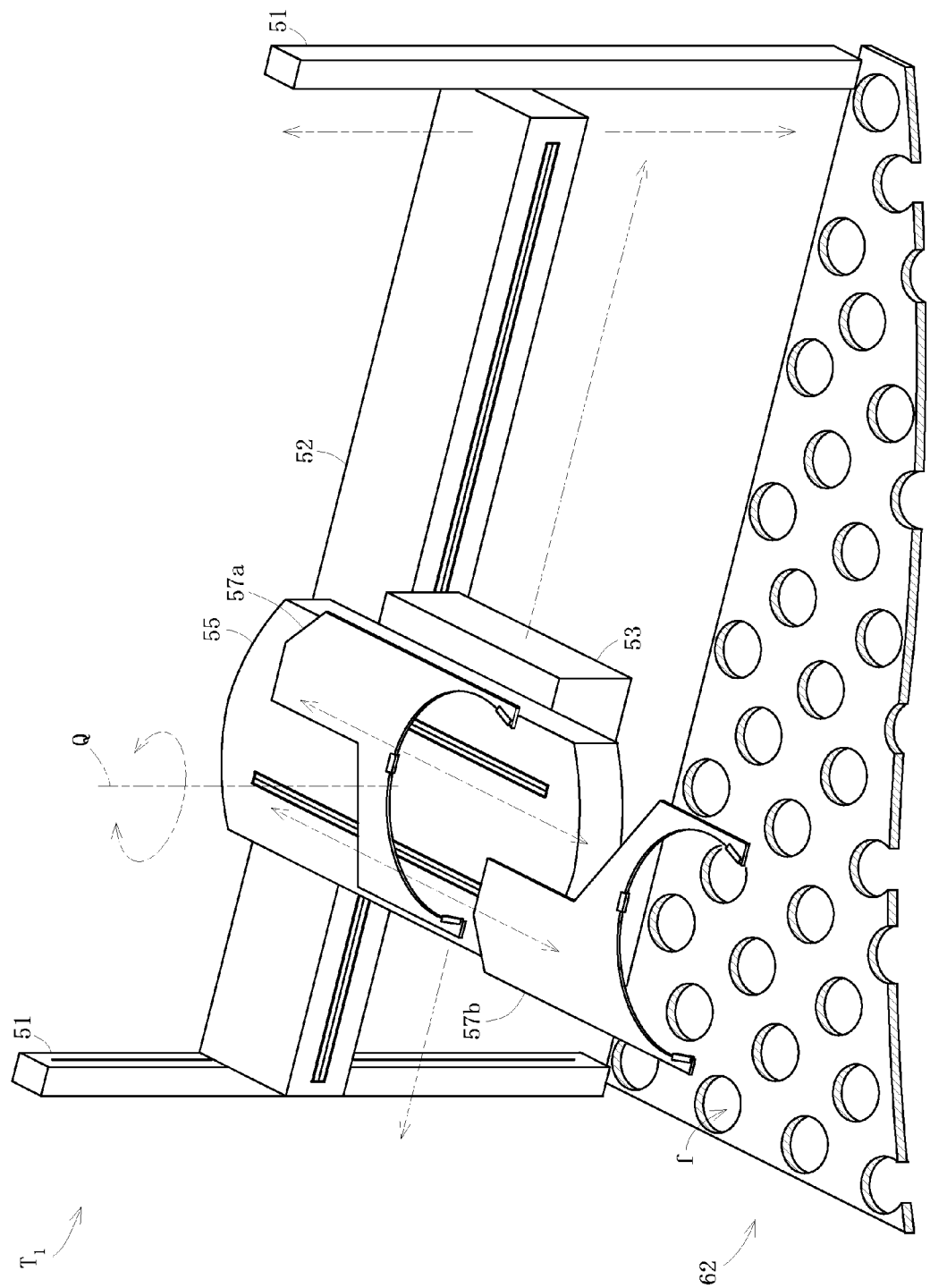
FIG. 9 is a perspective view of a main transport mechanism.

Reference is made to FIG. 9. FIG. 9 is a perspective view of the main transport mechanism $T_1$. The main transport mechanism $T_1$ has two guide rails 51 for providing vertical guidance, and a guide rail 52 for providing horizontal guidance. The vertical guide rails 51 are fixed opposite each other at one side of the transporting space $A_1$. In this embodiment, the vertical guide rails 51 are arranged at the side adjacent the coating units 31. The horizontal guide rail 52 is slidably attached to the vertical guide rails 51. The horizontal guide rail 52 has a base 53 slidably attached thereto. The base 53 extends transversely, substantially to the center of the transporting space $A_1$. Further, drive members (not shown) are provided for vertically moving the horizontal guide rail 52, and horizontally moving the base 53. The drive members are operable to move the base 53 to positions for accessing the coating units 31 and heat-treating units 41 arranged vertically and horizontally.

The base 53 has a turntable 55 rotatable about a vertical axis Q. The turntable 55 has two holding arms 57a and 57b horizontally movably attached thereto for holding wafers W, respectively. The two holding arms 57a and 57b are arranged vertically close to each other. Further, drive members (not shown) are provided for rotating the turntable 55, and moving the holding arms 57a and 57b. The drive members are operable to move the turntable 55 to positions opposed to the coating units 31, heat-treating units 41 and receivers $PASS_1$ and $PASS_2$, and to extend and retract the holding arms 57a and 57b to and from the coating units 31 and so on.

[Third Cell 13]

The third cell 13 will be described next. Like reference numerals are used to identify like parts which are the same as in the first cell 11, and will not be described again. The layout in plan view of the main transport mechanism $T_3$ and treating units in the third cell 13 is substantially the same as in the first cell 11. It can be said, therefore, that the coating units 31 are vertically stacked over the different stories of the first cell 11 and third cell 13. Similarly, it can be said that the heat-treating units 41 also are vertically stacked over the different stories. The arrangement of the various treating units of the third cell 13 as seen from the main transport mechanism $T_3$ is substantially the same as the arrangement of the various treating units of the first cell 11 as seen from the main transport mechanism $T_1$.

In the following description, when distinguishing the resist film coating units RESIST in the first and third cells 11 and 13, subscripts "1" and "3" will be affixed (for example, the resist film coating units RESIST in the first cell 11 will be referred to as "resist film coating units $RESIST_1$").

[First Cell 11 and Third Cell 13]

Figure 4:
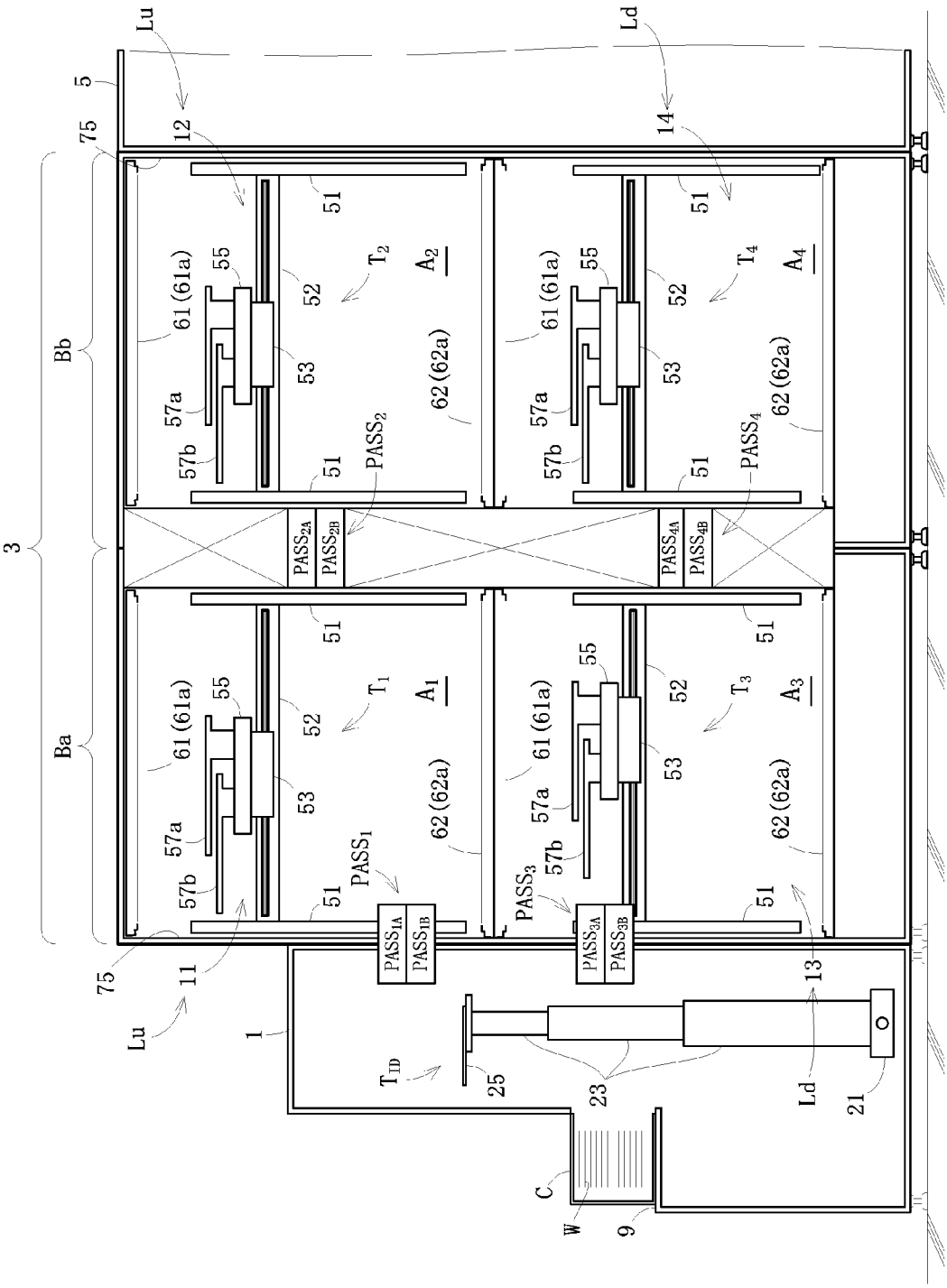
FIG. 4 is a view in vertical section taken on line a-a of FIG. 1.

Reference is made to FIG. 4. Constructions relevant to the first cell 11 and third cell 13 will be described collectively. The receiver $PASS_1$ is disposed between the ID section 1 and first cell 11. The receiver $PASS_3$ is disposed between the ID section 1 and third cell 13. The receivers $PASS_1$ and $PASS_3$ are arranged in plan view at the ends of the transporting spaces $A_1$ and $A_3$ adjacent the ID section 1, respectively. Seen in a sectional view, the receiver $PASS_1$ is disposed at a height adjacent a lower part of the main transport mechanism $T_1$, while the receiver $PASS_3$ is disposed at a height adjacent an upper part of the main transport mechanism $T_3$. Therefore, the positions of receiver $PASS_1$ and receiver $PASS_3$ are close to each other for allowing the ID's transport mechanism $T_{ID}$ to access the receiver $PASS_1$ and receiver $PASS_3$ using only a small amount of vertical movement.

Each of the receiver PASS1 and receiver PASS3 includes a plurality of (two) receivers arranged one over the other. Of the two receivers PASS1, one PASS1A serves to pass wafers W from the ID's transport mechanism TID to the main transport mechanism T1, and the wafers W are deposited on the receiver PASS1A solely by the ID's transport mechanism TID. The other receiver PASS1B serves to pass wafers W from the main transport mechanism T1 to the ID's transport mechanism TID, and the wafers W are deposited on the receiver PASS1B solely by the main transport mechanism T1. Each of the receivers PASS2, PASS4, PASS5 and PASS6 described hereinafter similarly includes two receivers used for transferring wafers W in opposite directions. For example, one of the receivers PASS2 is receiver PASS2A, and the other of the receivers PASS2 is receiver PASS2B. One of the receivers PASS3 is receiver PASS3A, and the other of the receivers PASS3 is receiver PASS3B. One of the receivers PASS4 is receiver PASS4A, and the other of the receivers PASS4 is receiver PASS4B. One of the receivers PASS5 is receiver PASS5A, and the other of the receivers PASS5 is receiver PASS5B. One of the receivers PASS6 is receiver PASS6A, and the other of the receivers PASS6 is receiver PASS6B.

The receiver $PASS_2$ is disposed between the first cell 11 and second cell 12. The receiver $PASS_4$ is disposed between the third cell 13 and fourth cell 14. The receivers $PASS_2$ and $PASS_4$ are arranged in the same position in plan view. Buffers for temporarily storing wafers W and heat-treating units for heat-treating wafers W (neither being shown) are arranged in appropriate positions above and below the receivers $PASS_2$ and $PASS_4$.

Each of the transporting spaces $A_1$ and $A_3$ has a first blowout unit 61 for blowing out a clean gas, and an exhaust unit 62 for sucking the gas. Each of the first blowout unit 61 and exhaust unit 62 is in the form of a flat box having substantially the same area as the transporting space $A_1$ in plan view. Each of the first blowout unit 61 and exhaust unit 62 has first blowout openings 61a or exhaust openings 62a formed in one surface thereof. In this embodiment, the first blowout openings 61a or exhaust openings 62a are in the form of numerous small bores f. The first blowout units 61 are arranged over the transporting spaces $A_1$ and $A_3$ with the first blowout openings 61a directed downward. The exhaust units 62 are arranged under the transporting spaces $A_1$ and $A_3$ with the exhaust openings 62a directed upward. The atmosphere in the transporting space $A_1$ and the atmosphere in the transporting space $A_3$ are blocked off by the exhaust unit 62 of the transporting space $A_1$ and the first blowout unit 61 of the transporting space $A_3$. The first blowout openings 61a correspond to the gas supply ports in this embodiment. The exhaust openings 62a correspond to the gas exhaust ports in this embodiment. The first blowout units 61 correspond to the blowout units in this embodiment.

Referring to FIG. 5, the first blowout units 61 of the transporting spaces $A_1$ and $A_3$ are connected to a common, first gas supply pipe 63. The first gas supply pipe 63 extends laterally of the receivers $PASS_2$ and $PASS_4$ from an upper position of the transporting space $A_1$ to a lower position of the transporting space $A_3$, and is bent below the transporting space $A_3$ to extend horizontally. The other end of the first gas supply pipe 63 is connected to a gas source not shown. Similarly, the exhaust units 62 of the transporting spaces $A_1$ and $A_3$ are connected to a common, first gas exhaust pipe 64. The first gas exhaust pipe 64 extends laterally of the receivers $PASS_2$ and $PASS_4$ from a lower position of the transporting space $A_1$ to a lower position of the transporting space $A_3$, and is bent below the transporting space $A_3$ to extend horizontally. As the gas is blown out of each first blowout opening 61a and sucked and exhausted through each exhaust opening 62a of the transporting spaces $A_1$ and $A_3$, gas currents are formed to flow from top to bottom of the transporting spaces $A_1$ and $A_3$, thereby keeping each of the transporting spaces $A_1$ and $A_3$ in a clean state.

Each coating unit 31 of the first and third cells 11 and 13 has a pit portion PS extending vertically. The pit portion PS accommodates a second gas supply pipe 65 extending vertically for supplying the clean gas, and a second gas exhaust pipe 66 extending vertically for exhausting the gas. Each of the second gas supply pipe 65 and second gas exhaust pipe 66 branches at a predetermined height in each coating unit 31 to extend substantially horizontally from the pit portion PS. A plurality of branches of the second gas supply pipe 65 are connected to second blowout units 67 for blowing out the gas downward. A plurality of branches of the second gas exhaust pipe 66 are connected for communication to the bottoms of the respective cups 33. The other end of the second gas supply pipe 65 is connected to the first gas supply pipe 63 below the third cell 13. The other end of the second gas exhaust pipe 66 is connected to the first gas exhaust pipe 64 below the third cell 13. As the gas is blown out of the second blowout units 67 and exhausted through the second exhaust pipes 62a, the atmosphere inside each cup 33 is constantly maintained clean, thereby allowing for excellent treatment of the wafer W held by the spin holder 32.

The pit portions PS further accommodate piping of the treating solutions, electric wiring and the like (not shown). Thus, with the pit portions PS accommodating the piping and electric wiring provided for the coating units 31 of the first and third cells 11 and 13, the piping and electric wiring can be reduced in length.

The main transport mechanisms $T_1$ and $T_3$ and treating units of the first cell 11 and third cell 13 are mounted in one housing 75. (See FIG. 4). This housing 75 defines one treating block Ba. The treating block Ba integrating the first cell 11 and third cell 13 corresponds to the coating block in this embodiment. Similarly, the main transport mechanisms $T_2$ and $T_4$ and treating units of the second cell 12 and fourth cell 14 described hereinafter are mounted in a different housing 75. This housing 75 defines another treating block Bb. The treating block Bb integrating the second cell 12 and fourth cell 14 corresponds to the developing block in this embodiment. Thus, with the housings 75 defining the treating blocks Ba and Bb integrating the cells arranged vertically, the treating section 3 may be manufactured and assembled simply.

[Second Cell 12]

The second cell 12 will be described next. Like reference numerals are used to identify like parts which are the same as in the first cell 11 and will not be described again. The second cell 12 has a transporting space $A_2$ formed as an extension of the transporting space $A_1$.

The treating units of the second cell 12 are developing units DEV for developing wafers W, heat-treating units 42 for heat-treating the wafers W, and an edge exposing unit EEW for exposing peripheral regions of the wafers W. The developing units DEV are arranged at one side of the transporting space $A_2$, and the heat-treating units 42 and edge exposing unit EEW are arranged at the other side of the transporting space $A_2$. Preferably, the developing units DEV are arranged at the same side as the coating units 31. It is also preferable that the heat-treating units 42 and edge exposing unit EEW are arranged in the same row as the heat-treating units 41.

In one embodiment, the number of developing units DEV is four, and sets of two units DEV arranged horizontally along the transporting space $A_2$ are stacked one over the other. Each developing unit DEV includes a spin holder 77 for holding and spinning a wafer W, and a cup 79 surrounding the wafer W. The two developing units DEV arranged at the lower level are not separated from each other by a partition wall or the like. A supply device 81 is provided for supplying developers to the two developing units DEV. The supply device 81 includes two slit nozzles 81a having a slit or a row of small bores for delivering the developers. The slit or row of small bores, preferably, has a length corresponding to the diameter of wafer W. Preferably, the two slit nozzles 81a are arranged to deliver developers of different types or concentrations. The supply device 81 further includes a moving mechanism 81b for moving each slit nozzle 81a. Thus, the slit nozzles 81a are movable, respectively, over the two spin holders 77 juxtaposed sideways.

The plurality of heat-treating units 42 are arranged sideways along the transporting space $A_2$, and stacked one over the other. Each heat-treating unit 42 includes a heating unit HP for heating wafers W and a cooling unit CP for cooling wafers W.

The single edge exposing unit EEW is disposed in a predetermined position. The edge exposing unit EEW includes a spin holder (not shown) for holding and spinning a wafer W, and a light emitter (not shown) for exposing edges of the wafer W held by the spin holder.

The receiver $PASS_5$ and heating and cooling units PHP are stacked in a position facing the transporting space $A_2$ and adjacent the IF section 5. The stack of receiver $PASS_5$ and heating and cooling units PHP has one side thereof located adjacent one of the heat-treating units 42, and is aligned with the heat-treating units 42. As distinct from the heat-treating units 42 of the second cell 12, the heating and cooling units PHP rely on the IF's transport mechanism TIF for transport of wafers W. In terms of layout, the heating and cooling units PHP are mounted in the same housing 75 as the second and fourth cells 12 and 14. These heating and cooling units PHP and receiver $PASS_5$ are constructed for allowing wafers W to be loaded and unloaded through the front thereof opposed to the transporting space $A_2$ and the side opposed to the IF section 5.

The main transport mechanism $T_2$ is disposed substantially centrally of the transporting space $A_2$ in plan view. The main transport mechanism $T_2$ has the same construction as the main transport mechanism $T_1$. The main transport mechanism T2 transports wafers W to and from the receiver $PASS_2$, various heat-treating units 42, edge exposing unit EEW and receiver $PASS_5$.

[Fourth Cell 14]

Like reference numerals are used to identify like parts which are the same as in the first and second cells 11 and 12, and will not be described again. The layout in plan view of the main transport mechanism $T_4$ and treating units in the fourth cell 14 is substantially the same as that of the second cell 12. The arrangement of the various treating units of the fourth cell 14 as seen from the main transport mechanism $T_4$ is substantially the same as the arrangement of the various treating units of the second cell 12 as seen from the main transport mechanism $T_2$. Thus, the developing units DEV of the second cell 12 and fourth cell 14 are stacked vertically. Similarly, the heat-treating units 42 of the second cell 12 and fourth cell 14 are stacked vertically.

[Second Cell 12 and Fourth Cell 14]

Constructions relevant to the second cell 12 and fourth cell 14 also are substantially the same as the constructions relevant to the first cell 11 and third cell 13, and will be described briefly. Each of the transporting spaces $A_2$ and $A_4$ of the second and fourth cells 12 and 14 also has constructions corresponding to the first blowout unit 61 and exhaust unit 62. Each developing unit DEV of the second and fourth cells 12 and 14 also has constructions corresponding to the second blowout unit 67 and second gas exhaust pipe 66.

In the following description, when distinguishing the developing units DEV, edge exposing units EEW, and so on in the second and fourth cells 12 and 14, subscripts "2" and "4" will be affixed (for example, the heating units HP in the second cell 12 will be referred to as "heating units HP2").

[IF Section 5, etc.]

Figure 7:
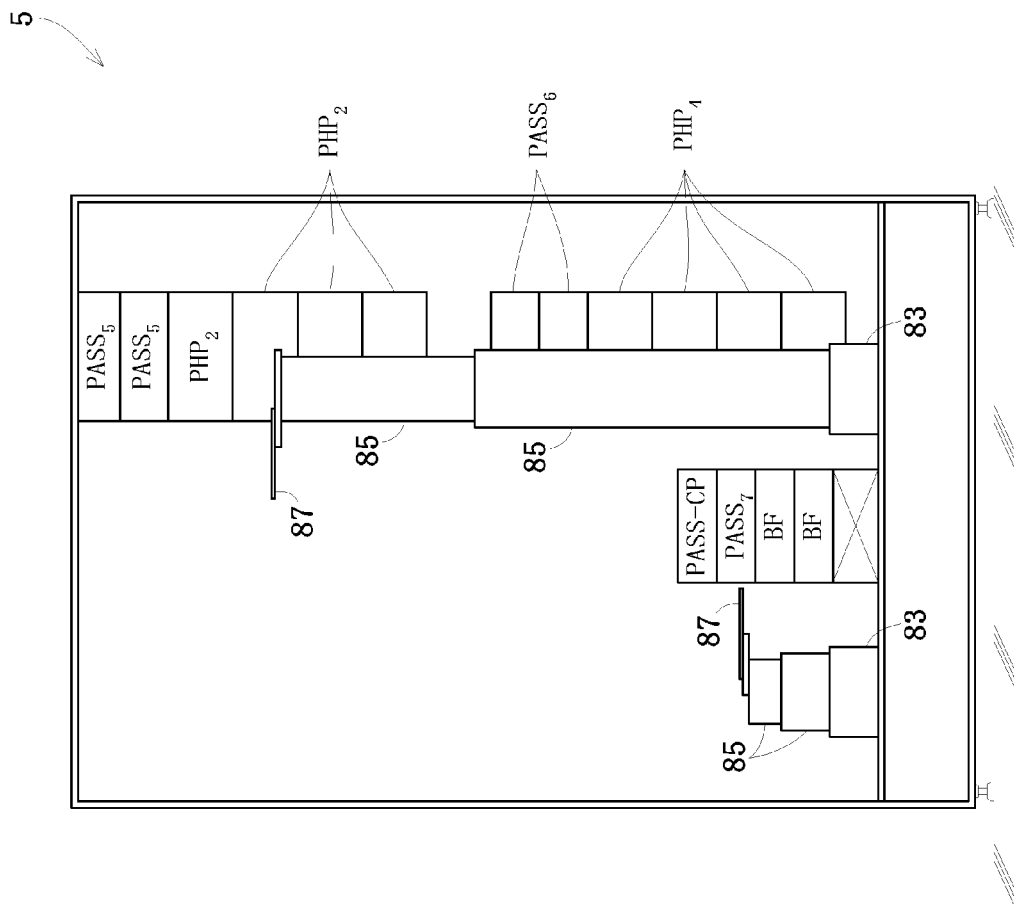
FIG. 7 is a view in vertical section taken on line d-d of FIG. 1.

Reference is now made to FIG. 1 and FIG. 7. The first transport mechanism TIFA and second transport mechanism TIFB are arranged in a direction perpendicular to the arrangement of cells 11 and 12 (13 and 14). The first transport mechanism $T_{IFA}$ is disposed at the side where the heat-treating units 42 and so on of the second and fourth cells 12 and 14 are located. The second transport mechanism $T_{IFB}$ is disposed at the side where the developing units DEV of the second fourth cells 12 and 14 are located. Stacked in multiples stages between the first and second transport mechanisms $T_{IFA}$ and $T_{IFB}$ are a receiver PASS-CP for receiving and cooling wafers W, a receiver $PASS_7$ for receiving wafers W, and buffers BF for temporarily storing wafers W.

The first transport mechanism $T_{IFA}$ includes a fixed base 83, lift shafts 85 vertically extendible and contractible relative to the base 83, and a holding arm 87 swivelable on the lift shafts 85, and extendible and retractable radially of the swivel motion, for holding a wafer W. The first transport mechanism TIFA transports wafers W between the heating and cooling units ($PHP_2$, $PHP_4$), receivers ($PASS_5$, $PASS_6$, PASS-CP) and buffers BF. The second transport mechanism $T_{IFB}$ also has a base 83, lift shafts 85 and a holding arm 87 for transporting wafers W between the receivers (PASS-CP, $PASS_7$) and exposing machine EXP.

Figure 10:
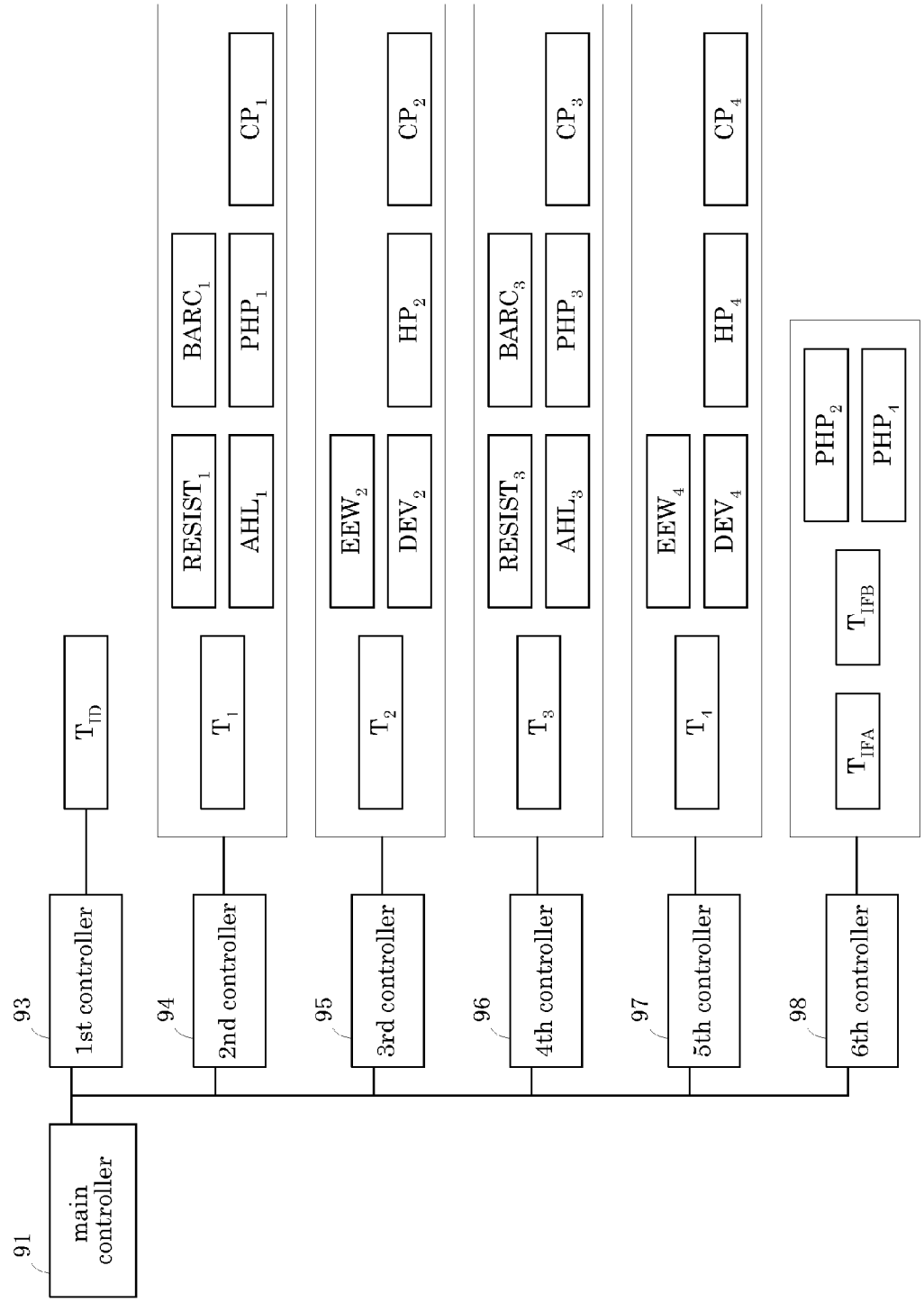
FIG. 10 is a control block diagram of the substrate treating apparatus according to an embodiment of the present invention.

A control system of this apparatus will be described next. FIG. 10 is a control block diagram of the substrate treating apparatus according to the embodiment. As shown, this apparatus includes a main controller 91 and a first to a sixth controllers 93, 94, 95, 96, 97 and 98.

The first controller 93 controls substrate transport by the ID's transport mechanism $T_{ID}$. The second controller 94 controls substrate transport by the main transport mechanism $T_1$, and substrate treatment in the resist film coating units $RESIST_1$, antireflection film coating units $BARC_1$, cooling units $CP_1$, heating and cooling units $PHP_1$ and adhesion units $AHL_1$. The third controller 95 controls substrate transport by the main transport mechanism $T_2$, and substrate treatment in the edge exposing unit $EEW_2$, developing units $DEV_2$, heating units $HP_2$ and cooling units $CP_2$. The controls by the fourth and fifth controllers 96 and 97 correspond to those by the second and third controllers 94 and 95, respectively. The sixth controller 98 controls substrate transport by the first and second transport mechanisms $T_{IFA}$ and $T_{IFB}$, and substrate treatment in the heating and cooling units $PHP_2$ and $PHP_4$. The first to sixth controllers 93-98 carry out the controls independently of one another.

The main controller 91 performs overall control of the first to sixth controllers 93-98. Specifically, the main controller 91 controls coordination among the transport mechanisms. For example, the main controller 91 adjusts the timing of the respective transport mechanisms making access to the receivers $PASS_1$-$PASS_6$. The main controller 91 also controls wafers W to be transported to the exposing machine EXP in the order in which the wafers W are fetched from the cassettes C.

Each of the main controller 91 and the first to sixth controllers 93-98 is realized by a central processing unit (CPU) which performs various processes, a RAM (Random Access Memory) used as the workspace for operation processes, and a storage medium such as a fixed disk for storing a variety of information including a predetermined processing recipe (processing program). The main controller 91 and the first to sixth controllers 93-98 correspond to the controller in this embodiment.

Figure 11:
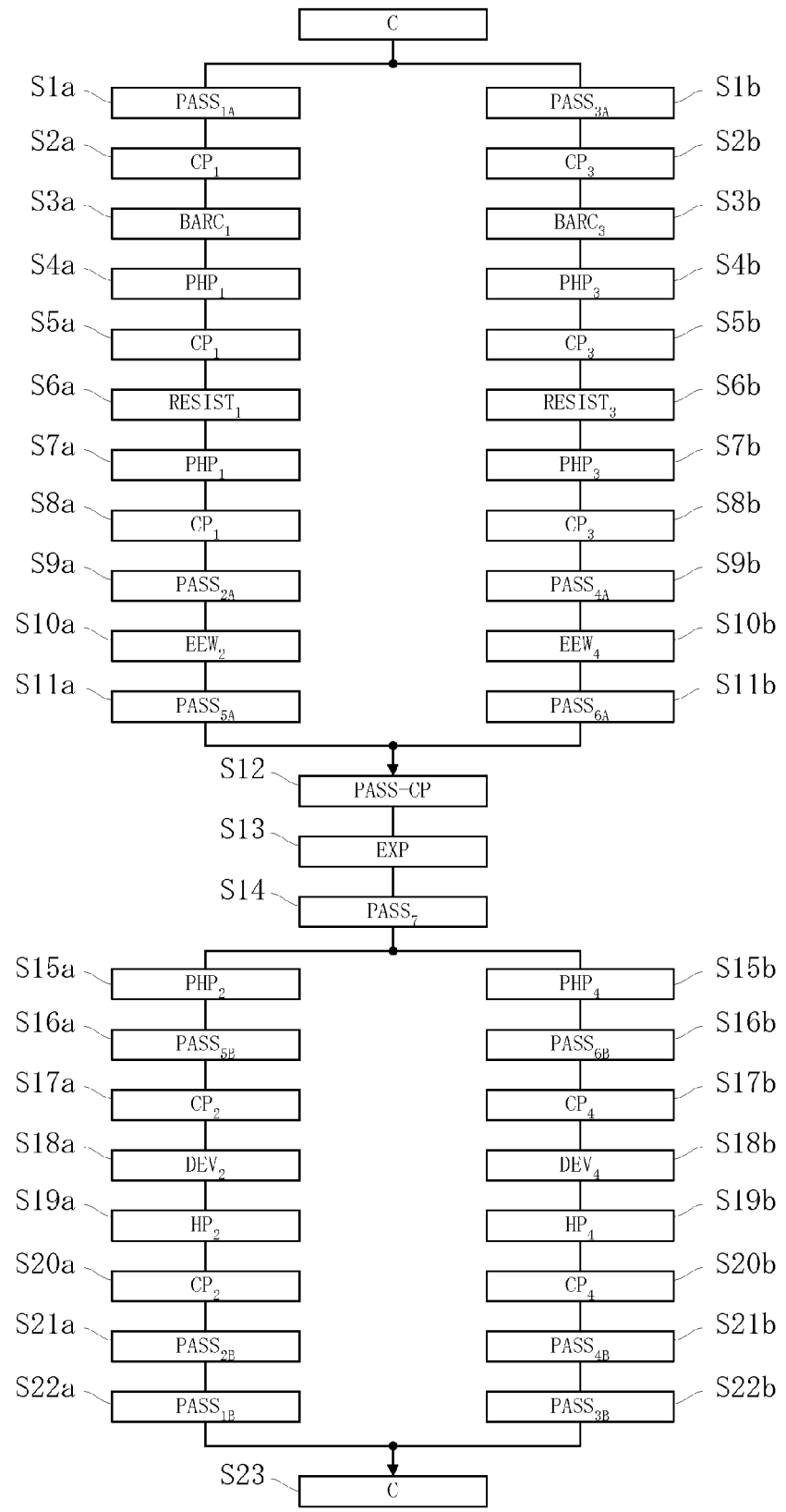
FIG. 11 is a flow chart of a series of treatments of wafers W.
Figure 12:
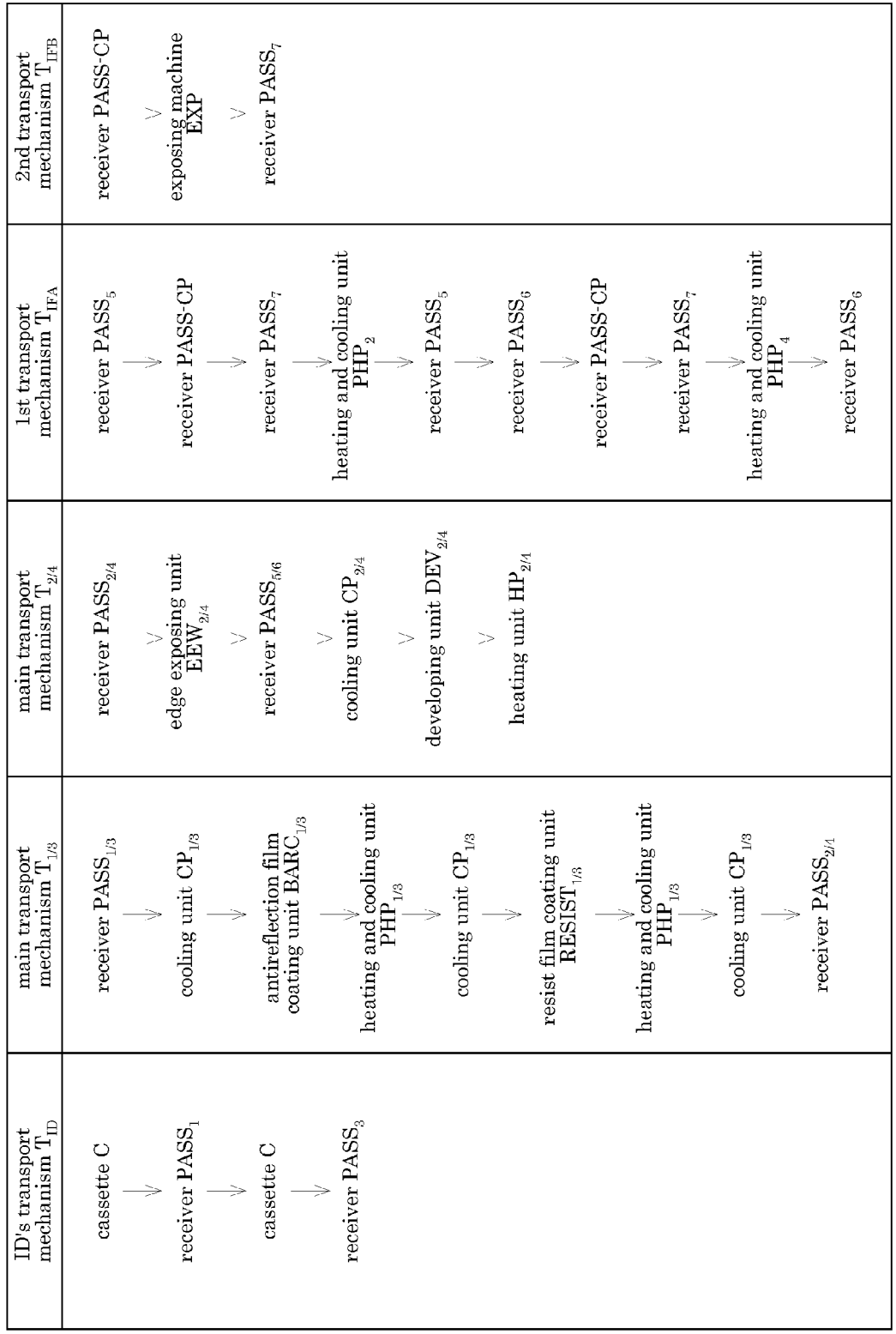
FIG. 12 is a view schematically showing operations repeated by each transport mechanism.

Next, operation of the substrate treating apparatus in this embodiment will be described. FIG. 11 is a flow chart of a series of treatments of wafers W, indicating the treating units and receivers to which the wafers W are transported in order. FIG. 12 is a view schematically showing operations repeated by each transport mechanism, and specifying an order of treating units, receivers and cassettes accessed by the transport mechanisms. The following description will be made separately for each transport mechanism.

[ID's Transport Mechanism $T_{ID}$]

The ID's transport mechanism $T_{ID}$ moves to a position opposed to one of the cassettes C, holds with the holding arm 25 a wafer W to be treated and takes the wafer W out of the cassette C. The ID's transport mechanism $T_{ID}$ swivels the holding arm 25, vertically moves the lift shaft 23, moves to a position opposed to the receiver $PASS_1$, and places the wafer W on the receiver $PASS_{1A}$ (which corresponds to step S1$a$ in FIG. 11; only step numbers will be indicated hereinafter). At this time, a wafer W usually is present on the receiver $PASS_{1B}$, and the ID's transport mechanism $T_{ID}$ receives this wafer W and stores it in a cassette C (step S23). When there is no wafer W on the receiver $PASS_{1B}$ the ID's transport mechanism $T_{1D}$ just accesses the cassette C. Then, the ID's transport mechanism $T_{1D}$ transports a wafer W from the cassette C to the receiver $PASS_{3A}$ (step S1$b$). Here again, if a wafer W is present on the receiver $PASS_{3B}$, the ID's transport mechanism $T_{ID}$ will store this wafer W in a cassette C (step S23).

The ID's transport mechanism $T_{ID}$ repeats the above operation. This operation is controlled by the first controller 93. As a result, the wafers W taken out one at a time from the cassette C are transported alternately to the first cell 11 and third cell 13.

[Main Transport Mechanisms $T_1$, $T_3$]

Since operation of the main transport mechanism $T_3$ is substantially the same as operation of the main transport mechanism $T_1$, only the main transport mechanism $T_1$ will be described. The main transport mechanism $T_1$ moves to a position opposed to the receiver $PASS_1$. At this time, the main transport mechanism $T_1$ holds, on one holding arm 57 (e.g. 57$b$), a wafer W received immediately before from the receiver $PASS_{2B}$. The main transport mechanism T1 places this wafer W on the receiver $PASS_{1B}$ (step S22), and holds the wafer W present on the receiver $PASS_{1A}$ with the other holding arm 57 (e.g. 57a).

The main transport mechanism $T_1$ accesses a predetermined one of the cooling units $CP_1$. There is a different wafer W having already received a predetermined heat treatment (cooling) in the cooling unit $CP_1$. The main transport mechanism $T_1$ holds the different wafer W with the unloaded holding arm 57 (holding no wafer W), takes it out of the cooling unit $CP_1$, and loads into the cooling unit $CP_1$ the wafer W having received from the receiver $PASS_{1A}$. Then, the main transport mechanism $T_1$, holding the cooled wafer W, moves to one of the antireflection film coating units $BARC_1$. The cooling unit $CP_1$ starts heat treatment (cooling) of the wafer W loaded therein (step S2). It is assumed that, when the main transport mechanism $T_1$ subsequently accesses the different heat-treating units 41 and coating units 31, wafers W having received predetermined treatments are present in these treating units (31 and 41).

Accessing the antireflection film coating unit $BARC_1$, the main transport mechanism $T_1$ takes a wafer W having antireflection film formed thereon from the antireflection film coating unit $BARC_1$, and places the cooled wafer W on the spin holder 32 of the antireflection film coating unit $BARC_1$. Then, the main transport mechanism $T_1$, holding the wafer W having antireflection film formed thereon, moves to one of the heating and cooling units $PHP_1$. The antireflection film coating unit $BARC_1$ starts treatment of the wafer W placed on the spin holder 32 (step S3).

Specifically, the spin holder 32 spins the wafer W in horizontal posture, the gripper 26 grips one of the nozzles 35, the nozzle moving mechanism 37 moves the gripped nozzle 35 to a position above the wafer W, and the treating solution for antireflection films is supplied from the nozzle 35 to the wafer W. The treating solution supplied spreads all over the wafer W, and is scattered away from the wafer W. The cup 33 collects the scattering treating solution. In this way, the treatment is carried out for forming antireflection film on the wafer W.

Accessing the heating and cooling unit $PHP_1$, the main transport mechanism $T_1$ takes a wafer W having received heat treatment out of the heating and cooling unit $PHP_1$, and loads the wafer W having antireflection film formed thereon into the heating and cooling unit $PHP_1$. Then, the main transport mechanism $T_1$, holding the wafer W taken out of the heating and cooling unit $PHP_1$, moves to one of the cooling units $CP_1$. The heating and cooling unit $PHP_1$ receives a wafer W successively on the two plates 43, to heat the wafer W on one of the plates 43 and then to cool the wafer W on the other plate 43 (step S4).

Having moved to the cooling unit $CP_1$, the main transport mechanism $T_1$ takes a wafer W out of the cooling unit $CP_1$, and loads the wafer W held by the transport mechanism $T_1$ into the cooling unit $CP_1$. The cooling unit $CP_1$ cools the wafer W loaded therein (step S5).

Then, the main transport mechanism $T_1$ moves to one of the resist film coating units $RESIST_1$. The main transport mechanism $T_1$ takes a wafer W having resist film formed thereon from the resist film coating unit $RESIST_1$, and loads the wafer W held by the main transport mechanism $T_1$ into the resist film coating unit $RESIST_1$. The resist film coating unit $RESIST_1$ supplies the resist film material while spinning the wafer W loaded therein, to form resist film on the wafer W (step S6).

The main transport mechanism $T_1$ further moves to one of the heating and cooling units $PHP_1$ and one of the cooling units $CP_1$. The main transport mechanism $T_1$ loads the wafer W having resist film formed thereon into the heating and cooling unit $PHP_1$, transfers a wafer W treated in the heating and cooling unit $PHP_1$ to the cooling unit $CP_1$, and receives a wafer W treated in the cooling unit $CP_1$. The heating and cooling unit $PHP_1$ and cooling unit $CP_1$ carry out predetermined treatments of newly loaded wafers W, respectively (steps S7 and S8).

The main transport mechanism $T_1$ moves to the receiver $PASS_2$, places the wafer W it is holding on the receiver $PASS_{2A}$ (step S9), and receives a wafer W present on the receiver $PASS_{2B}$ (step S21).

Subsequently, the main transport mechanism $T_1$ accesses the receiver $PASS_1$ again, and repeats the above operation. This operation is controlled by the second controller 94. Having received a wafer W from the receiver $PASS_1$, the main transport mechanism $T_1$ transports this wafer W to a predetermined treating unit (a cooling unit $CP_1$ in this embodiment), and takes a treated wafer W from this treating unit. Subsequently, the main transport mechanism $T_1$ moves to a plurality of treating units in order, and transfers wafers W treated in the respective treating units to other treating units. Whenever a treated wafer W is replaced by a wafer W to be treated, each treating unit (31, 41) starts the predetermined treatment. Thus, predetermined treatments are carried out in parallel for a plurality of wafers W in the respective treating units. A series of treating steps is successively performed for a plurality of wafers W. In these circumstances, the second controller 94 controls periods of the series of treating steps to be uniform. Further, it is preferred to control the timing of transporting wafers W to each treating unit (31, 41) and a schedule of treatment carried out in each treating unit (31, 41) to be uniform between the wafers W. As a result, the series of treatments is completed in order, starting with a wafer W first placed on the receiver $PASS_1$. The wafers W are forwarded to the receiver $PASS_2$ in the order in which they are placed on the receiver $PASS_1$. Similarly, the main transport mechanism $T_1$ places the wafers W on the receiver $PASS_1$ in the order of receipt from the receiver $PASS_2$.

[Main Transport Mechanisms $T_2$, $T_4$]

Since operation of the main transport mechanism $T_4$ is substantially the same as operation of the main transport mechanism $T_2$, only the main transport mechanism $T_2$ will be described. The main transport mechanism $T_2$ moves to a position opposed to the receiver $PASS_2$. At this time, the main transport mechanism $T_2$ holds a wafer W received from a cooling unit $CP_2$ accessed immediately before. The main transport mechanism $T_2$ places this wafer W on the receiver $PASS_{2B}$ (step S21), and holds the wafer W present on the receiver $PASS_{2A}$ (step S9).

The main transport mechanism $T_2$ accesses the edge exposing unit $EEW_2$. The main transport mechanism $T_2$ receives a wafer W having received a predetermined treatment in the edge exposing unit $EEW_2$, and loads the cooled wafer W into the edge exposing unit $EEW_2$. While spinning the wafer W loaded therein, the edge exposing unit $EEW_2$ irradiates peripheral regions of the wafer W with light from the light emitter not shown, thereby exposing the peripheral regions of the wafer W (step S10).

The main transport mechanism $T_2$, holding the wafer W received from the edge exposing unit $EEW_2$, accesses the receiver $PASS_5$. The main transport mechanism $T_2$ places the wafer W on the receiver $PASS_{5A}$ (step S11), and holds a wafer W present on the receiver $PASS_{5B}$ (step S16).

The main transport mechanism $T_2$ moves to one of the cooling units $CP_2$, and replaces a wafer W in the cooling unit $CP_2$ with the wafer W held by the main transport mechanism $T_2$. The main transport mechanism $T_2$ holds the wafer W having received cooling treatment, and accesses one of the developing units $DEV_2$. The cooling unit $CP_2$ starts treatment of the newly loaded wafer W (step S17).

The main transport mechanism $T_2$ takes a developed wafer W from the developing unit $DEV_2$, and places the cooled wafer W on the spin holder 77 of the developing unit $DEV_2$. The developing unit $DEV_2$ develops the wafer W placed on the spin holder 77 (step S18). Specifically, while the spin holder 77 spins the wafer W in horizontal posture, the developer is supplied from one of the slit nozzles 81$a$ to the wafer W, thereby developing the wafer W.

The main transport mechanism $T_2$ holds the developed wafer W, and accesses one of the heating units $HP_2$. The main transport mechanism $T_2$ takes a wafer W out of the heating unit $HP_2$, and loads the wafer W it is holding into the heating unit $HP_2$. Then, the main transport mechanism $T_2$ transports the wafer W taken out of the heating unit $HP_2$ to one of the cooling units $CP_2$, and takes out a wafer W already treated in this cooling unit $CP_2$. The heating unit $HP_2$ and cooling unit $CP_2$ carry out predetermined treatments for the newly loaded wafers W, respectively (steps S19 and S20).

Subsequently, the main transport mechanism $T_2$ accesses the receiver $PASS_2$ again, and repeats the above operation. This operation is controlled by the third controller 95. As a result, the wafers W are forwarded to the receiver $PASS_{5B}$ in the order in which they are placed on the receiver $PASS_{2A}$. Similarly, the wafers W are forwarded to the receiver $PASS_{5B}$ in the order in which they are placed on the receiver $PASS_{5B}$.

[IF's Transport Mechanisms $T_{IF}$—First Transport Mechanism $T_{IFA}$]

The first transport mechanism $T_{IFA}$ accesses the receiver $PASS_5$, and receives the wafer W present on the receiver $PASS_{5A}$ (step S11$a$). The first transport mechanism $T_{IFA}$, holding the wafer W received, moves to the receiver PASS-CP, and loads the wafer W on the receiver PASS-CP (step S12).

Next, the first transport mechanism $T_{IFA}$ receives a wafer W from the receiver $PASS_7$ (step S14), and moves to a position opposed to one of the heating and cooling units $PHP_2$. The first transport mechanism $T_{IFA}$ takes a wafer W having received heat treatment (PEB: Post Exposure Bake) from the heating and cooling unit $PHP_2$, and loads the wafer W received from the receiver PASS7 into the heating and cooling unit $PHP_2$. The heating and cooling unit $PHP_2$ carries out heat treatment for the newly loaded wafer W (step S15).

The first transport mechanism $T_{IFA}$ transports the wafer W taken out of the heating and cooling unit $PHP_2$ to the receiver $PASS_{SB}$. Subsequently, the first transport mechanism $T_{IFA}$ transports a wafer W from the receiver $PASS_{6A}$ to the receiver PASS-CP (Step S11$b$, 12). Next, the first transport mechanism $T_{IFA}$ transports a wafer W from the receiver $PASS_7$ to one of the heating and cooling units $PHP_4$. At this time, the first transport mechanism $T_{IFA}$ takes out a wafer W having been treated in the heating and cooling unit $PHP_4$, and places the wafer W on the receiver $PASS_{6B}$.

Subsequently, the first transport mechanism $T_{IFA}$ accesses the receiver $PASS_5$ again and repeats the above operation. This operation is controlled by the sixth controller 98. By transporting wafers W alternately from the receivers $PASS_5$ and $PASS_6$ to the receiver PASS-CP, the wafers W are placed on the receiver PASS-CP in the order in which the ID's transport mechanism TID has taken them out of the cassette C.

However, the controls of transport to and from the treating units by the main transport mechanisms T and treatment in the treating units are carried out independently for each of the cells 11-14. That is, no adjustment is made to the timing of feeding wafers W to each of the receiver $PASS_5$ and receiver $PASS_6$. Therefore, the order of feeding wafers W to the receiver $PASS_5$ and receiver $PASS_6$ may not agree with the order in which they are taken out of the cassette C due to a fault such as a delay in substrate treatment or transportation. In such a case, the sixth controller 98 operates the first transport mechanism $T_{IFA}$ as follows.

When wafers W fail to be fed to either one of the receiver $PASS_{5A}$ and receiver $PASS_{6A}$, and wafers W are placed on the other receiver, the wafers W placed on the other receiver is transported to the buffers BF instead of the receiver PASS-CP. When wafers W begin to be placed again on the receiver for which the feeding has been disrupted, the wafers W are transported from the receiver now restored to service to the receiver PASS-CP, and also from the buffers BF to the receiver PASS-CP. At this time, the wafers W are transported alternately from the restored receiver and buffers BF to the receiver PASS-CP. As a result, even when the order of feeding wafers W to the receiver $PASS_5$ and receiver $PASS_6$ disagrees with the order in which they are taken out of the cassette C, the order of wafers W transported to the receiver PASS-CP is in agreement with the order of wafers W taken out of the cassette C.

[IF's Transport Mechanisms $T_{IF}$—Second Transport Mechanism $T_{IFB}$]

The second transport mechanism $T_{IFB}$ takes a wafer W out of the receiver PASS-CP, and transports it to the exposing machine EXP. Then, the second transport mechanism $T_{IFB}$ receives an exposed wafer W from the exposing machine EXP, and transports it to the receiver $PASS_7$.

Subsequently, the second transport mechanism $T_{IFB}$ accesses the receiver PASS-CP again and repeats the above operation. This operation also is controlled by the sixth controller 98. As described above, the first and second transport mechanisms $T_{IFA}$ and $T_{IFB}$ cooperate to feed wafers W to the exposing machine EXP in the order in which they are taken out of the cassette C.

The substrate treating apparatus according to this embodiment has two substrate treatment lines Lu and Ld arranged one over the other. This construction can substantially double the processing capabilities in the treatment for forming anti-reflection film and resist film and in the treatment for developing wafers W. Therefore, the throughput of the substrate treating apparatus is improved drastically.

Each of the substrate treatment lines Lu and Ld includes the main transport mechanisms T arranged in one row. This arrangement can inhibit an increase in the installation area of the treating section 3.

The arrangements of the main transport mechanisms $T_1$ and $T_3$ ($T_2$ and $T_4$) and treating units in the two, upper and lower, substrate treatment lines Lu (Ld) are substantially the same in plan view, which can simplify the construction of the apparatus.

The construction of the apparatus may be simplified by providing the same type of treating units for the two, upper and lower, substrate treatment lines Lu and Ld to perform the same series of treatments.

The treating units of the upper and lower cells 11 and 13 (12, 14) are stacked together. This arrangement can simplify the construction of treating blocks Ba and Bb each including two, upper and lower cells.

Each of the treating blocks Ba and Bb has a housing 75 which collectively supports the two, upper and lower, main transport mechanisms T and the plurality of treating units. This allows the substrate treating apparatus to be manufactured efficiently and to be maintained and repaired easily.

Each of the transporting spaces $A_1$-$A_4$ has the first blowout openings 61a and discharge openings 62a, which can keep each transporting space A clean.

The first blowout openings 61a are arranged over each transporting space A, and the discharge openings 62a under each transporting space A, to produce substantially vertical, downward gas currents in the transporting space A. This prevents the temperature environment of transporting spaces A, coating units 31 and developing units DEV from being influenced by the heat from the heat-treating units 41.

The exhaust unit 62 provided in the transporting space $A_1$ ($A_2$) and the first blowout unit 61 provided in the transporting space $A_3$ ($A_4$) block off the atmospheres of each of the transporting spaces $A_1$ and $A_3$ ($A_2$ and $A_4$). Thus, each transporting space A can be maintained clean. The apparatus construction is simplified since no special or additional component is required for blocking off atmosphere.

The first gas supply pipe 61 is provided as a component common to the first blowout units 61 of the upper and lower transporting spaces $A_1$ and $A_3$. This reduces piping installation space and simplifies the apparatus construction.

The receivers $PASS_1$ and $PASS_3$ are provided for transferring wafers W between the ID's transport mechanism $T_{ID}$ and main transport mechanisms $T_1$ and $T_3$, which can prevent lowering of the transporting efficiency of the ID's transport mechanism $T_{ID}$ and main transport mechanisms $T_1$ and $T_3$. Similarly, the transporting efficiency of each transport mechanism is prevented from lowering by transferring wafers W between the transport mechanisms through the receivers PASS.

Since the receiver $PASS_1$ and receiver $PASS_3$ are locate close to each other, the ID's transport mechanism $T_{ID}$ can access the receiver $PASS_1$ and receiver $PASS_3$ through a reduced amount of vertical movement.

The main controller 91 and the first to sixth controllers 93-98 are provided to control movement of wafers W to bring into agreement the order of fetching from a cassette C and the order of feeding to the exposing machine EXP. This enables supervision or follow-up check of each wafer W without providing a construction for identifying the wafers W.

The common, second gas supply pipe 65 is provided for the coating units 31 (developing units DEV) in the upper and lower cells 11 and 13 (12 and 14). This reduces piping installation space and simplifies the apparatus construction.

This invention is not limited to the foregoing embodiment, but may be modified as follows:

(1) The foregoing embodiment provides two substrate treatment lines Lu and Ld, but the invention not limited to this. The construction may be modified to include three or more substrate treatment lines vertically arranged in multiple stages.

(2) In the foregoing embodiment, each substrate treatment line Lu (Ld) has two cells 11 and 12 (13 and 14) connected to each other. The invention is not limited to this. Each substrate treatment line may have three or more cells.

(3) In the foregoing embodiment, the substrate treatment lines Lu and Ld carry out the treatment for forming resist film and antireflection film on the wafers W, and the treatment for developing exposed wafers W. The substrate treatment lines may be modified to perform other treatment such as cleaning of the wafers W. Accordingly, the type, number and the like of treating units are selected or designed as appropriate. Further, the substrate treating apparatus may be constructed to exclude the IF section 5.

(4) In the foregoing embodiment, the two substrate treatment lines Lu and Ld perform the same series of treatments. Instead, the substrate treatment lines Lu and Ld may be modified to perform different treatments.

(5) In the foregoing embodiment, the two substrate treatment lines Lu and LD have substantially the same plane layout. Instead, each of the substrate treatment lines Lu and Ld (i.e. upper and lower cells) may have the main transport mechanisms T and treating units arranged differently.

(6) In the foregoing embodiment, the upper and lower cells 11 and 13 (12 and 14) have the same arrangement of treating units as seen from the main transport mechanisms T. Instead, the upper and lower cells may have different arrangements of treating cells.

(7) In the foregoing embodiment, each of the cells 11-14 has the treating units arranged at opposite sides of the transporting space A. Instead, the treating units may be arranged at only one side.

(8) In the foregoing embodiment, wafers W are transferred between the transport mechanisms through the receivers PASS. Instead, the wafers W may be transferred directly between the transport mechanisms, for example.

(9) The foregoing embodiment may be modified to include buffers BF and cooling units CP arranged over and/or under the receivers $PASS_1$, $PASS_2$, $PASS_3$ and $PASS_4$. This construction allows the wafers W to be stored temporarily or cooled as appropriate.

(10) In the foregoing embodiment, the IF transport mechanisms TIF include two transport mechanisms TIFA and TIFB. The IF section may be modified to include one transport mechanism or three or more transport mechanisms.

(11) The foregoing embodiment provides no partition or the like between the antireflection film coating unit BARC and resist film coating unit RESIST, but allows the atmosphere to be shared between these coating units. Instead, the atmospheres of the two units may be blocked off as appropriate.

(12) In the foregoing embodiment, one first blowout unit 61 and one exhaust unit 62 are constructed to block off the atmosphere of each of the transporting spaces $A_1$ and $A_3$ ($A_2$ and $A_4$). The invention is not limited to this. For example, only one of the first blowout unit 61 and exhaust unit 62 may block off atmosphere. Alternatively, a shielding plate may be provided separately from the first blowout unit 61 and exhaust unit 62 for blocking off the atmosphere of each of the upper and lower transporting spaces A.

(13) In the foregoing embodiment, the first blowout unit 61 is disposed over each transporting space A, and the exhaust unit 62 disposed under each transporting space. Instead, the first blowout unit 61 or exhaust unit 62 may be disposed laterally of each transporting space A. The first blowout unit 61 and exhaust unit 62 may be shared by the transporting spaces $A_1$ and $A_2$ ($A_3$ and $A_4$) of the same substrate treatment line Lu (Ld).

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
   a first treating block arranged horizontally adjacent to a second treating block; each treating block having an upper story and a lower story;
   each treating block including a plurality of cells arranged vertically with an upper cell arranged on the upper story directly above a lower cell arranged on the lower story, a first cell is located on the upper story of the first treating block and a second cell is located on the upper story of the second treating block; a third cell is located on the lower story of the first treating block and a fourth cell is located on the lower story of the second treating block; said first cell is directly above said third cell, said second cell is located directly above said fourth cell;

each cell comprising treating units for treating substrates; and a single main transport mechanism disposed in a transporting space of each cell; said single transport mechanism transports the substrates to the treating units; said single main transport includes a horizontal guide rail slidably attached to two vertical guide rails, the single main transport mechanism includes a base slidably attached to the horizontal guide rail, each single main transport mechanism is confined to one cell, wherein the treating units include solution treating units for treating the substrates with solutions, and heat-treating units for heat-treating the substrates;

the heat-treating units include cooling units for cooling the substrates;

the transporting space has a belt shape and extends through a center of each cell in plan view;

all the solution treating units are arranged at a first side of the transporting space;

all the heating-treating units are arranged at a second side of the transporting space;

the first side and the second side of the transporting space are opposed to each other;

the single main transport mechanism is located on the first side of the transporting space;

the first cell of the first treating block is juxtaposed horizontally and connected to the second cell of the second treating block to form an upper substrate treatment line;

the third cell of the first treating block is juxtaposed horizontally and connected to the fourth cell of the second treating block to form a lower substrate treatment line;

the single main transport mechanism and the treating units are in a same layout in plan view for the lower cell and the upper cell directly above the lower cell of each treating block;

the solution treating units are in a same layout in side view for the lower cell and the upper cell directly above the lower cell of each treating block;

the heat-treating units are in a same layout in side view for the lower cell and the upper cell directly above the lower cell of each treating block;

treating units in the lower cell and the upper cell directly above the lower cell of each treating block are configured to perform same treatments on the substrates.

2. The apparatus of claim 1, wherein the solution treating units include at least one of a resist film coating unit for forming resist film on the substrates, an anti-reflection film coating units for forming anti-reflection film on the substrates, and a developing unit for developing the substrates.

3. The apparatus of claim 1, comprising a first gas supply pipe for supplying a clean gas into the transport space of each cell.

4. The apparatus of claim 3, wherein the first gas supply pipe extends from an upper position of the transporting space of the upper cell to a lower position of the transporting space of the lower cell of a same treating block.

5. The apparatus of claim 3, wherein:

each cell has a blowout unit for supplying the clean gas into the transport space where the main transport mechanism is installed; and the same first gas supply pipe is connected to the blowout unit of each cell.

6. The apparatus of claim 1, comprising a second gas supply pipe for supplying a clean gas into the solution treating units, the clean gas supplied through a first end of the second gas supply pipe.

7. The apparatus of claim 6, comprising:

a pit portion formed laterally of the solution treating units of each cell and extending vertically;

wherein the pit portion accommodates the second gas supply pipe extending vertically.

8. The apparatus of claim 7, wherein:

the second gas supply pipe being branched at each cell to extend horizontally from the pit portion; and a plurality of branches of the second gas supply pipe are connected, respectively, to second blowout units for blowing out the gas downward.

9. The apparatus of claim 6, comprising:

a first gas supply pipe for supplying the clean gas into the transport space of each cell;

wherein a second end of the second gas supply pipe is connected to the first gas supply pipe.

10. The apparatus of claim 7, wherein the pit portion accommodates at least one of piping of the treating solutions or electric wiring.

* * * * *